United States Patent
Pember et al.

(10) Patent No.: US 6,360,353 B1
(45) Date of Patent: Mar. 19, 2002

(54) AUTOMATED ALTERNATING CURRENT CHARACTERIZATION TESTING

(75) Inventors: Bruce Pember, San Jose; Christine Odero, Sunnyvale; Honda Yang, Santa Clara, all of CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/236,957

(22) Filed: Jan. 25, 1999

Related U.S. Application Data

(60) Provisional application No. 60/075,631, filed on Feb. 21, 1998.

(51) Int. Cl.[7] .................................................. G06F 17/50
(52) U.S. Cl. .................................................. 716/4; 716/12
(58) Field of Search ..................... 716/4, 12; 703/14, 703/15, 22; 714/738, 739, 30, 33, 42; 395/500, 501, 502, 503, 504, 505

(56) References Cited

U.S. PATENT DOCUMENTS

| | | | |
|---|---|---|---|
| 5,535,223 A | 7/1996 | Horstmann et al. | 371/27 |
| 5,684,808 A | 11/1997 | Valind | 371/22.3 |
| 5,696,772 A | 12/1997 | Lesmeister | 371/27 |
| 5,974,241 A | 10/1999 | Fusco | 395/500.03 |
| 5,974,248 A | 10/1999 | Graef | |
| 5,983,381 A | 11/1999 | Chakradhar et al. | |
| 5,995,740 A | 11/1999 | Johnson | 395/500.41 |
| 6,047,247 A | 4/2000 | Iwanishi et al. | |

OTHER PUBLICATIONS

Huston, R.E., "Pin Margin Analysis", Proceedings International Test Conference, pp. 655–662, Nov. 1997.

Sakashita et al., "A Built–In–Self–Test Circuit with Timing and Margin Test Function in a 1 Gbit Synchronous DRAM", Proceedings International Test Conference, pp. 319–324, Oct. 1996.

Kamon et al., "Interconnect Parasitic Extraction in the Digital IC Design Methodology", Digest of Technical Papers IEEE/ACM International Conference on Computer Aided Design, pp.: 223–230, Nov. 1999.

Chakraborty, T.J.; Agrawal, V.D., "Simulation of At–Speed Tests for Stuck–At–Faults", Proceedings 13th IEEE VLSI Test Symposium, 1995. pp.: 216–220.

Beker et al., "Extraction of Parasitic Circuit Elements in a PEBB for Appliaction in the Virtual Test Bed", IEEE Industry Applications Converence, vol. 2, pp. 1217–1221, Oct. 1997.

S. Westfall, *"Memory Test—Debugging Test Vectors Without ATE"*, 11/97, pp. 663–669, IEEE, International Test Conf., TSSI Div., Summit Design, Inc., Beaverton, OR.

C.E. Cummings, *"Generating ASIC test vectors with Verilog"*, 7/94, pp. 63–70, IEEE, Tektronix, Inc., Beaverton, OR.

R. Ho, C. Yang, M. Horowitz and D. Dill, *"Architecture Validation for Processors"*, 6/95, pp. 404–413, IEEE, Computer Systems Laboratory, Stanford University, Stranford, CA.

*Primary Examiner*—Matthew Smith
*Assistant Examiner*—Calvin Lee
(74) *Attorney, Agent, or Firm*—Martine & Penilla, LLP

(57) ABSTRACT

Disclosed are methods and computer readable media containing program instructions for testing alternating current characteristics of a computer model of an integrated circuit design. The testing implements an associated AVF file and an associated DUT file for the integrated circuit design. The computer readable media includes: (a) program instructions for generating a test file containing data of a parameter of the integrated circuit design, the test file being generated based upon whether a pair of signals are either both inputs, or one is an input and another is an output; (b) program instructions for parsing through a chip file of the integrated circuit design in order to extract netlist information, external signal names, bus definitions, and pull-up information; (c) program instructions for parsing through the DUT file to extract input/output information, channel number information, and timing information; (d) program instructions for splitting data of the AVF file into input vector data and output vector data; (e) program instructions for generating an environment file that assists in simulating a physical test station; and (f) program instructions for running the environment file using the input vector data and the output vector data in order to generate a log that indicates alternating current test results for the parameter data.

11 Claims, 27 Drawing Sheets

| AVF GENERATOR DEFINITIONS ||
|---|---|
| (command line input) <br><br> >avfgen <-v> <-p> <-m filename>  <-o filename> <-n filename> <-t top> < top_instance> < -i> ||
| -v | Enable verbose option for debugging <br> *OPTIONAL* |
| -p | Do not make place holders for power pin s <br> *OPTIONAL* |
| -o filename | Output filename |
| -m filename | Load map file or multi port io cells where filename is the name for the pin to port mapping file. *OPTIONAL* |
| -n filename | Filename of netlist to parse |
| -t top instance | Name of top level modul e followed by instantiation name of top level module |
| -i iopad instance | Name of iopad module |
| -r reset_pin# | Pin number of power on reset <br> Instantiation name of iopad module |

FIG. 4A

| COMMAND LINE ENTRY |
|---|
| > avfgen -v -p -Ochip_avf.v -m chip.map |
| -n top.opus.vs -t u_top -i u_iopad -r 38 |

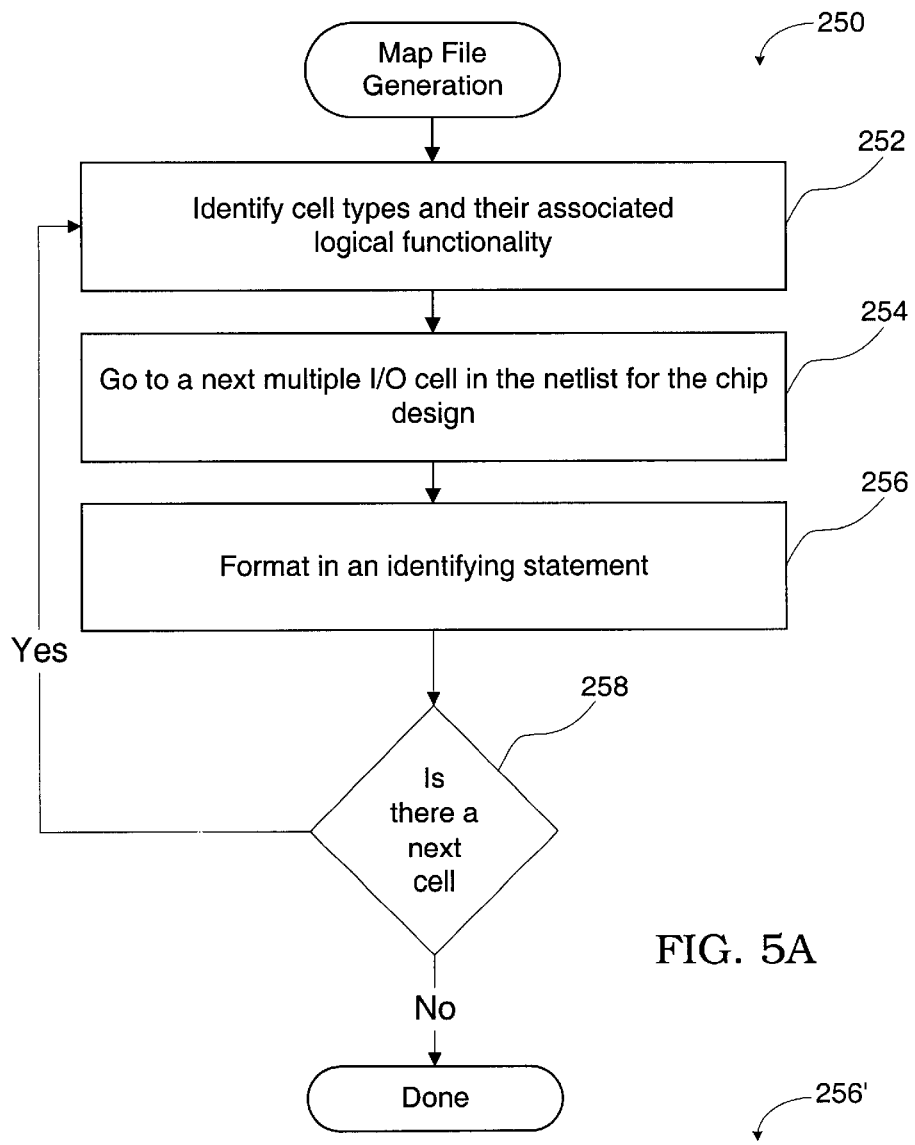
FIG. 5A
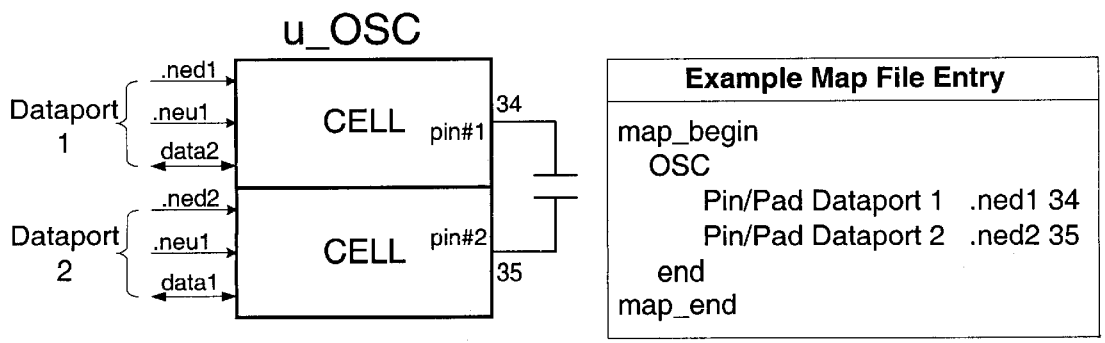
FIG. 5B
FIG. 5C

← 302'

| EXAMPLE PORT/NET TABLE ||||
|---|---|---|---|
| *Instance* | *Cell Type* | *Port     Net* | *Port     Net* |
| ⋮ | ⋮ | ⋮ ||
| PAD001 | IO Cell 1 | .neu 1 (Signal 1) | .ned 1 (Signal 2) |
| PAD002 | IO Cell 2 | .neu 1 (Signal 1) | .ned 1 (Signal 2) |
| PAD003 | IO Cell 3 | .neu 1 (Signal 1) | .ned 1 (Signal 2) |
| PAD004 | IO Cell 1 | .neu 1 (Signal 1) | .ned 1 (Signal 2) |
| PAD005-21 (multi-pin) | SCSI Cell 1 | .neu 1 (Signal 1) | .ned 1 (Signal 2) |
| PAD34-35 (multi-pin) | OSC Cell | .ned 1 (Signal 1)<br>.ned 2 (Signal 3) | .neu 1 (Signal 2)<br>.neu 2 (Signal 4) |
| ⋮ | ⋮ | ⋮ ||

| AVF DATA CONVERSION Truth Table ||||
|---|---|---|---|
| *Power On Reset* | *Output Enable* | *Value* | *AVF Data Output* |
| 1 | in | 1 | 1 |
| 1 | in | 0 | 0 |
| 1 | out | 1 | H |
| 1 | out | 0 | L |
| 0 | Don't Care | Don't Care | X |

FIG. 7B

| EXEMPLARY STATEMENT TIMING CALCULATION |
|---|

```
integer hd0_time;                      initial hd0_width = 0;
integer hd0_totalchange;               initial hd0_delay = 0;
integer hd0_cyclechange;               initial hd0_tgtype = 0;
integer hd0_maxchange;                 initial hd0_counter = 0;
integer hd0_minchange;                 initial hd0_totalchange = 0;
integer hd0_ave;                       initial hd0_cyclechange = 0;
integer hd0_num;                       initial hd0_maxchange = 0;
integer hd0_width;                     initial hd0_minchange = 0;
integer hd0_delay;                     initial hd0_num = 0;
integer hd0_tgtype;                    initial hd0_ave = 0;
integer hd0_counter;
reg hd0_strobed;

always @ (avfcycle)
 begin
   if ( (hd0_cyclechange = = 2) & (hd0_counter = = 10) )
      begin
        if (hd0_strobed)
          hd0_tgtype = 1;
        else
          hd0_tgtype = 2;
        $fdisplay (avflogfile, "WARNING: hd[0] has changed twice in 10 different
        $fdisplay (avflogfile, "WARNING: hd[0] is assuming a R%0d with delay = %
      end
   else if (hd0_counter < 10)
      hd0_delay < = 0;
   if (hd0_cyclechange = = 2)
      hd0_counter = hd0_counter +1;
   hd0_cyclechange = 0;
 end
always @ (test.u_top.hd[0] )
 if (hd0_cyclechange < 2)
    hd0_strobed < = test.u_top.hd[0];
always @ (test.u_top.hd[0] )
 if (hd0_oen)
  begin
    hd0_time = $time – cycle_start;
    hd0_totalchange = hd0_totalchange + 1;
    hd0_num = hd0_num + hd0_time;
    hd0_cyclechange = hd0_cyclechange + 1;
    if (hd0_cyclechange > 1) $ (hd0_counter < 10) )
      $fdisplay (avflogfile, "WARNING: hd[0] changes more than once in cycle %0d
    if (hd0_time > hd0_maxchange)
      hd0_maxchange = hd0_time;
    if (hd0_time < hd0_minchange)
      hd0_minchange = hd0_time;
    if ( (hd0_cyclechange = = 1) & (hd0_tgtype = = 0) )
      hd0_delay = hd0_time;
    if ( (hd0_cyclechange = = 2) & (hd0_tgtype = = 0) )
      hd0_ wdith = hd0_time – hd0_delay;
    if (avfclk)
      $fdisplay (avflogfile, "WARNING: hd[0] changes after strobe in cycle %0d",
    else
      if (hd0_totalchange = = 0)
        hd0_ave = 0;
      else
        hd0_ave = hd0_num / hd0_totalchange;
  end
```

FIG. 8B

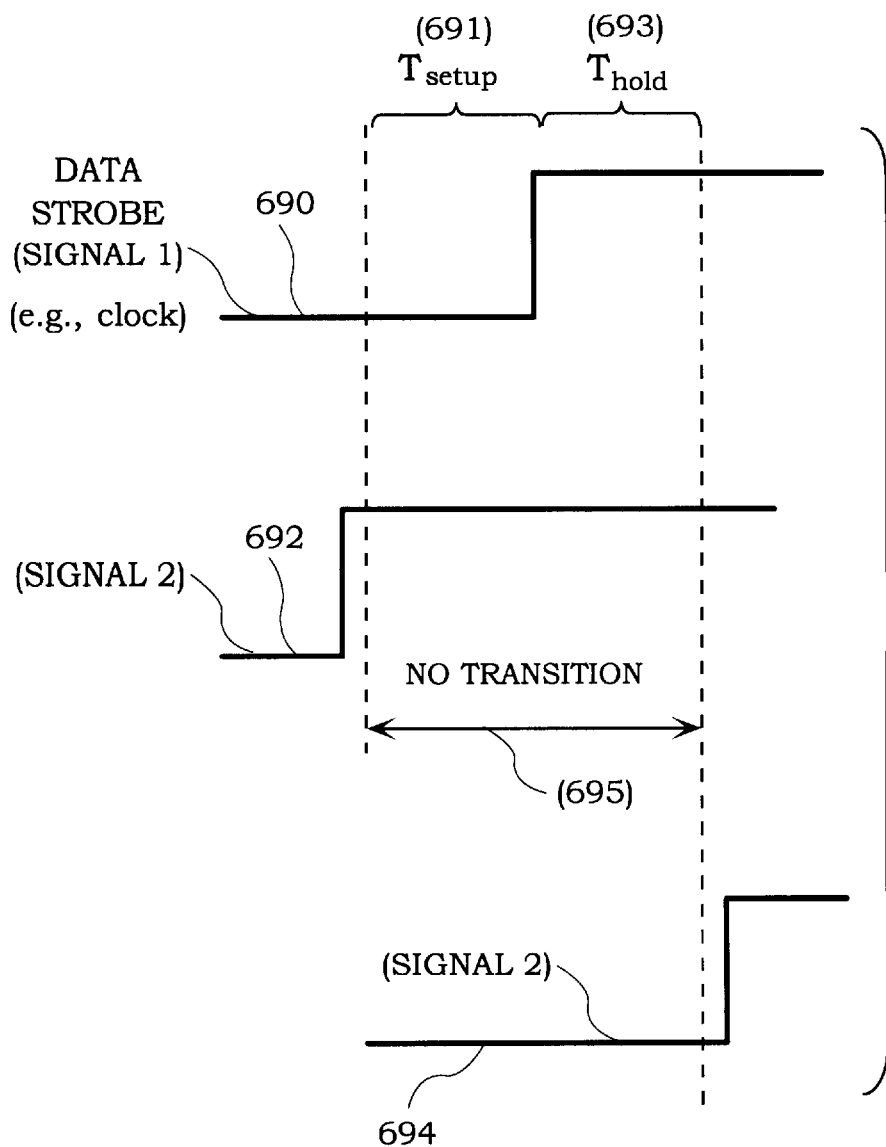
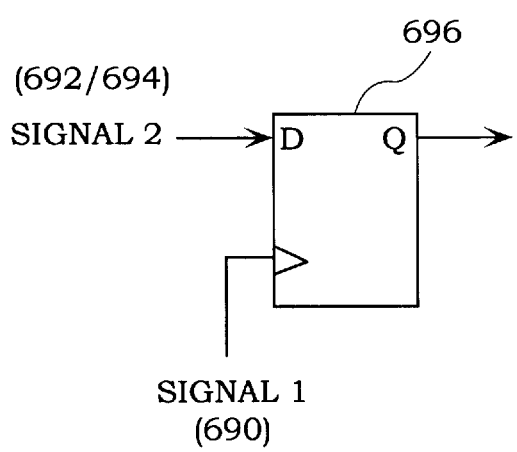

AUTOMATED ALTERNATING CURRENT CHARACTERIZATION TESTING

CROSS REFERENCE TO RELATED APPLICATIONS

This application claims the benefit of U.S. Provisional Patent Application having Ser. No. 60/075,631, filed on Feb. 21, 1998, entitled "Automated Test Vector Generation and Verification." This application also claims 35 U.S.C. § 120 priority of U.S. patent application Ser. No. 09/160,553, filed on Sep. 24, 1998, and entitled "Automated Test Vector Generation and Verification." These applications are hereby incorporated by reference.

BACKGROUND OF THE INVENTION

1. Field of the Invention

This invention relates generally to integrated circuits, and more particularly to methods for automated testing of alternating current characteristics of integrated circuit device chips.

2. Description of the Related Art

Testing integrated circuits that are ultimately fabricated onto silicon chips has over the years increased in complexity as the demand has grown, and continues to grow for faster and more densely integrated silicon chips. In an effort to automate the design and fabrication of circuit designs, designers commonly implement hardware descriptive languages (HDL), such as Verilog, to functionally define the characteristics of the design. The Verilog code is then capable of being synthesized in order to generate what is known as a "netlist." A netlist is essentially a list of "nets," which specify components (know as "cells") and their interconnections which are designed to meet a circuit design's performance constraints. The "netlist" therefore defines the connectivity between pins of the various cells of an integrated circuit design. To fabricate the silicon version of the design, well known "place and route" software tools that make use of the netlist data to design the physical layout, including transistor locations and interconnect wiring.

When testing of the digital model, various test vectors are designed in order to test the integrated circuit's response under custom stimulation. For example, if the integrated circuit is a SCSI host adapter chip, the test vectors will simulate the response of the SCSI host adapter chip as if it were actually connected to a host computer and some kind of peripheral device were connected to the chip. In a typical test environment, a test bench that includes a multitude of different tests are used to complete a thorough testing of the chip. However, running the test vectors of the test bench will only ensure that the computer simulated model of the chip design will work, and not the actual physical chip in its silicon form.

To test a silicon chip 12 after it has been packaged, it is inserted into a loadboard 14 that is part of a test station 10, which is shown in FIG. 1A. Although the model of the chip design was already tested using the test vectors of the test bench, these test vectors are not capable of being implemented in the test station 10 without substantial modifications, to take into account the differences between a "model" and a "physical" design. In the prior art, the conversion of a test model test vector into test vectors that can actually be run on the test station 10 required a very laborious process that was unfortunately prone to computer computational errors as well as human errors. Of course, if any type of error is introduced during the generation of the test vectors that will ultimately be run on the silicon chip 12, the testing results generated by the test station 10 would indicate that errors exist with the part, when in fact, the part functions properly. This predicament is of course quite costly, because fabrication plants would necessarily have to postpone release of a chip until the test station indicated that the part worked as intended.

As mentioned above, the prior art test vector generation methodology was quite laborious, which in many circumstances was exacerbated by the complexity of the tests and size of the chip being tested. The methodology required having a test engineer manually type up the commands necessary to subsequently generate a "print-on-change" file once executed using Verilog. Defining the commands for generating the print-on-change file includes, for example, typing in the output enable information for each pin, defining pin wires, setting up special over-rides for power-on reset pins, etc. At this point, the print-on-change file would then be generated using a Verilog program, which in turn uses the commands generated by the test engineer.

In addition to manually producing these commands, a separate parameter file having timing information is separately produced in a manual typing-in fashion by the engineer. The generated print-on-change file and the parameter file are then processed by a program that is configured to produce a test file, which is commonly referred to as an AVF file. However, the production of the AVF is very computationally intensive because the generated print-on-change file can be quite large. The size of the print-on-change file grows to very large sizes because every time a pin in the design changes states, a line of the print-on-change file is dumped. Thus, the more pins in the design, more CPU time is required to convert the print-on-change file into a usable AVF file. In some cases where the test is very large or complex, the host computer processing the print-on-change file is known to crash or in some cases lock-up due to the shear voluminous amount of data.

Unfortunately, as mentioned above, the generated AVF file may have defects, such as timing errors, which may translate into errors being reported by the test station 10. The problem here is that the test station 10 will stimulate the part differently than the stimulation designed for the digital version. This problem therefore presents a very time consuming test and re-test of the part by the test station 10. When re-testing is performed, many modifications to the parameter file, containing timing information, are performed in an effort to debug errors with the AVF file. Although some parts are in fact defective in some way, the test engineer is still commonly required to re-run the tests to determine whether the errors are due to a defective AVF file or the physical device.

In view of the foregoing, there is a need for a method that reduces test vector generation cycle time, as well as increases the accuracy of test vector generation and simulation processes. Another need exists for a method for automating the generation of the initial AVF file, the initial timing file, and performing alternating current parameter testing without having to do initial testing on the physical integrated circuit design circuit.

SUMMARY OF THE INVENTION

Broadly speaking, the present invention fills these needs by providing techniques for analyzing alternating current characteristics of a model of an integrated circuit design before being tested on a physical integrated circuit part. It should be appreciated that the present invention can be implemented in numerous ways, including as a process, an apparatus, a system, a device, a method, or a computer readable medium. Several inventive embodiments of the present invention are described below.

In one embodiment, a computer implemented method for testing alternating current characteristics of a computer model of an integrated circuit design is disclosed. The method includes: (a) supplying an AVF file and a DUT file of the integrated circuit design; (b) generating a test file containing data of a parameter of the integrated circuit design; (c) parsing through a chip file of the integrated circuit design in order to extract netlist information, external signal names, bus definitions, and pull-up information; (d) parsing through the DUT file to extract input/output information, channel number information, and timing information; (e) splitting data of the AVF file into input vector data and output vector data; (f) generating an environment file that assists in simulating a physical test station; and (g) running the environment file through Verilog using the input vector data and the output vector data in order to generate a log that indicates alternating current test results for the parameter data.

In another embodiment, a computer readable media containing program instructions for testing alternating current characteristics of a computer model of an integrated circuit design that includes an associated AVF file and an associated DUT file is disclosed. The computer readable media includes: (a) program instructions for generating a test file containing data of a parameter of the integrated circuit design; (b) program instructions for parsing through a chip file of the integrated circuit design in order to extract netlist information, external signal names, bus definitions, and pull-up information; (c) program instructions for parsing through the DUT file to extract input/output information, channel number information, and timing information; (d) program instructions for splitting data of the AVF file into input vector data and output vector data; (e) program instructions for generating an environment file that assists in simulating a physical test station; and (f) program instructions for running the environment file using the input vector data and the output vector data in order to generate a log that indicates alternating current test results for the parameter data.

In yet another embodiment, a computer readable media containing program instructions for testing alternating current characteristics of a computer model of an integrated circuit design that includes an associated AVF file and an associated DUT file is disclosed. The computer readable media includes: (a) program instructions for generating a test file containing data of a parameter of the integrated circuit design, the test file being generated based upon whether a pair of signals are either both inputs, or one is an input and another is an output; (b) program instructions for parsing through a chip file of the integrated circuit design in order to extract netlist information, external signal names, bus definitions, and pull-up information; (c) program instructions for parsing through the DUT file to extract input/output information, channel number information, and timing information; (d) program instructions for splitting data of the AVF file into input vector data and output vector data; (e) program instructions for generating an environment file that assists in simulating a physical test station; and (f) program instructions for running the environment file using the input vector data and the output vector data in order to generate a log that indicates alternating current test results for the parameter data.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIG. 4A illustrate example AVF generator commands in accordance with one embodiment of the present invention.

FIG. 5A illustrates a flowchart defining the method operations performed in generating a map file for a particular chip design in accordance with one embodiment of the present invention.

FIGS. 5B and 5C illustrate an example of a multiple I/O port cell and a map file entry in accordance with one embodiment of the present invention.

FIGS. 6B through 6D illustrate tables that are implemented during the generation of the AVF file and DUT file data in accordance with one embodiment of the present invention.

FIG. 7B illustrates an example of an AVF data conversion truth table, in accordance with one embodiment of the present invention.

FIG. 8B is a table illustrating an exemplary statement timing calculation in accordance with one embodiment of the present invention.

FIGS. 13A–13C illustrate a simplistic example of setup and hold testing for a D Flip Flop circuit, in accordance with one embodiment of the present invention.

DETAILED DESCRIPTION OF THE PREFERRED EMBODIMENTS

An invention for analyzing alternating current characteristics of a computer model of a packaged integrated circuit design before being tested on a physical test. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
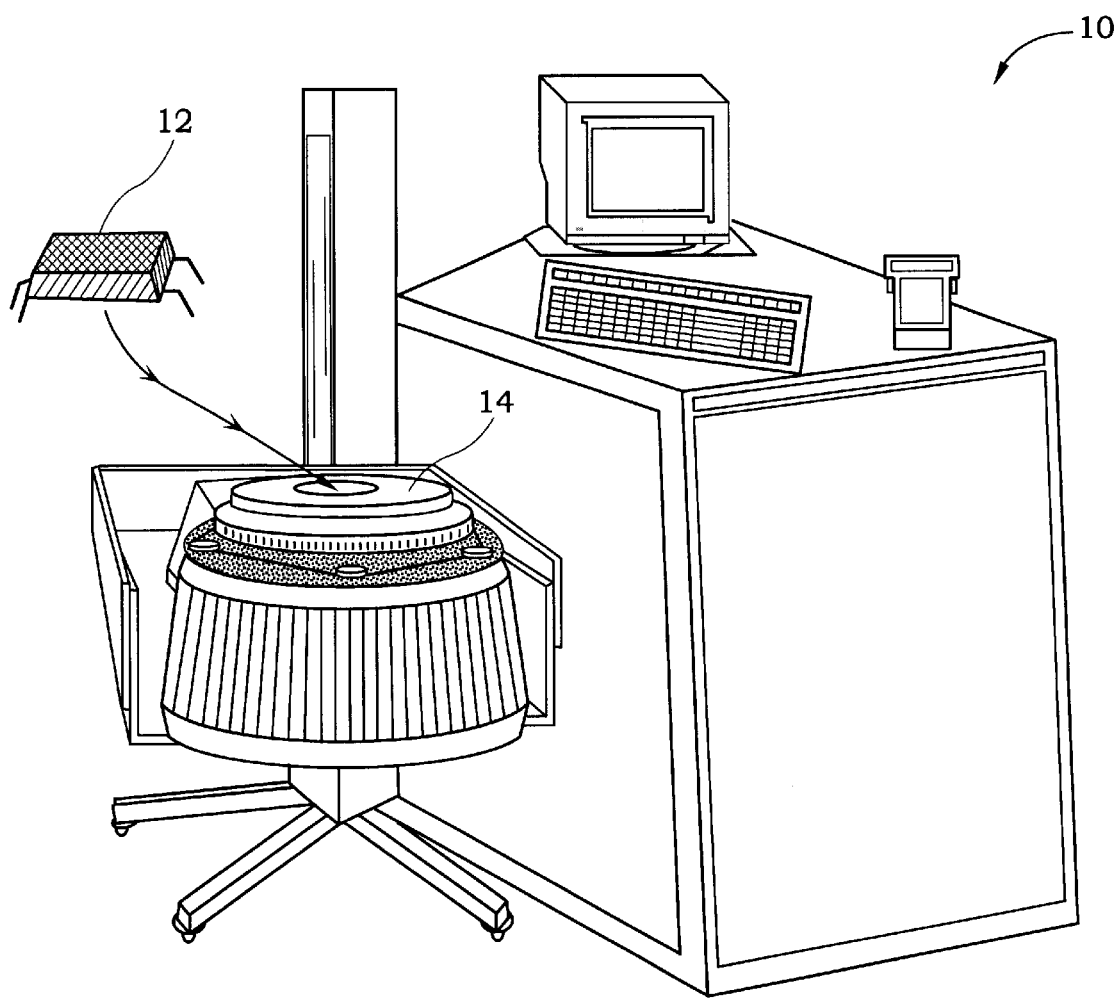
FIG. 1 illustrates a test station that is typically used in testing physical silicon integrated circuit devices.

As discussed above, FIG. 1 illustrates a test station 10 that is typically used in testing integrated circuit devices. The test station 10 typically includes a computer station which is coupled to a unit that has a loadboard 14. The loadboard 14, as is well known in the art, is used to receive integrated circuit devices 12. By the time testing is performed on the test station 10, the integrated circuit device 12 will be in a packaged form and has the proper package pins that will communicate with appropriate electrical receptacles on the load board 14. The following description will therefore detail the computer process implemented in automating the generation of test vectors and the automated verification of the test vectors before they are transferred to the test station 10 for use in testing the packaged circuit device 12. Section A will therefore describe the automated generation of the AVF file data and DUT timing file data (e.g., that includes the execution of avfgen and avf.v), and section B will describe the automated verification loop (e.g., that includes the execution of avf2vlg) that is executed to verify the generated AVF file data.

A. Automated AVF and DUT Data Generation

Figure 2:
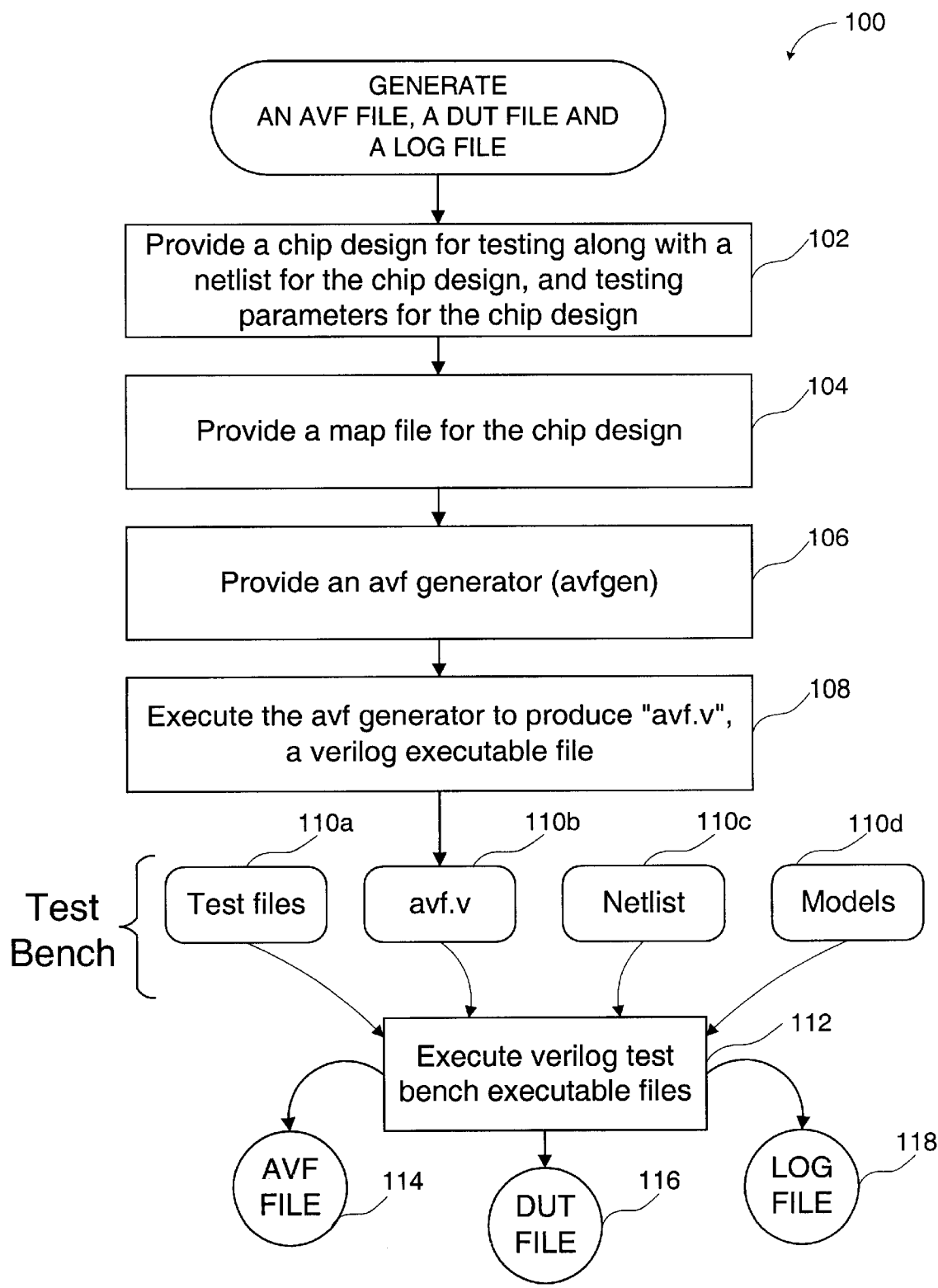
FIG. 2 illustrates a flowchart that details the operations performed in generating an AVF file, a DUT file, and a log file in accordance with one embodiment of the present invention.

FIG. 2 illustrates a flowchart 100 that details the operations performed in generating an AVF file, a DUT file, and a log file in accordance with one embodiment of the present invention. The method begins at an operation 102 where a chip design is provided for testing along with a netlist for the chip design. Also provided are testing parameters for the chip design, such as the file names for the chip design, the file name for the netlist, whether or not debugging information will be generated along with the file, instantiations for the chip and the I/O pads, the pin number for the power-on reset pin, etc.

Once these testing parameters have been provided in operation 102, the method will proceed to an operation 104 where a map file is provided for the chip design. As will be described below with reference to FIGS. 5A through 5C, the map file will identify a port/pin map list for each of the multiple port cells. Accordingly, for each multi-port cell, the instance for the cell, the ports for the cell, the enable information for the cell, and the pin numbers for the cell will be generated as an entry in the map file. Once a map file having a plurality of entries for each of the multi-port cells is provided, the method will proceed to an operation 106.

In operation 106, an AVF generator (avfgen) is provided, which is configured to be executed by using the information provided in operations 102 and 104. The method now proceeds to operation 108 where the AVF generator is executed to produce an "avf.v" file, which is a Verilog executable file. The avf.v file is then provided as part of a test bench for testing the target chip design. As shown, the test bench will generally include test files 110a, the avf.v file 110b, a netlist 110c for the chip design, and a set of models 110d. The test files 110a include information that details the wiring information for interconnecting the chip design to the set of models 110d. In addition, the test files 110a also include information that will detail the commands that are designed to stimulate the chip design under test and in accordance with the appropriate timing.

It should be noted that the avf.v file 110b is a generic file that will work with all of the tests provided in the test files 110a. Once the test bench has been established, the method will proceed to make the test bench information accessible to operation 112, where the test bench is executed to generate an AVF file 114, a DUT file 116, and a log file 118.

Figure 3:
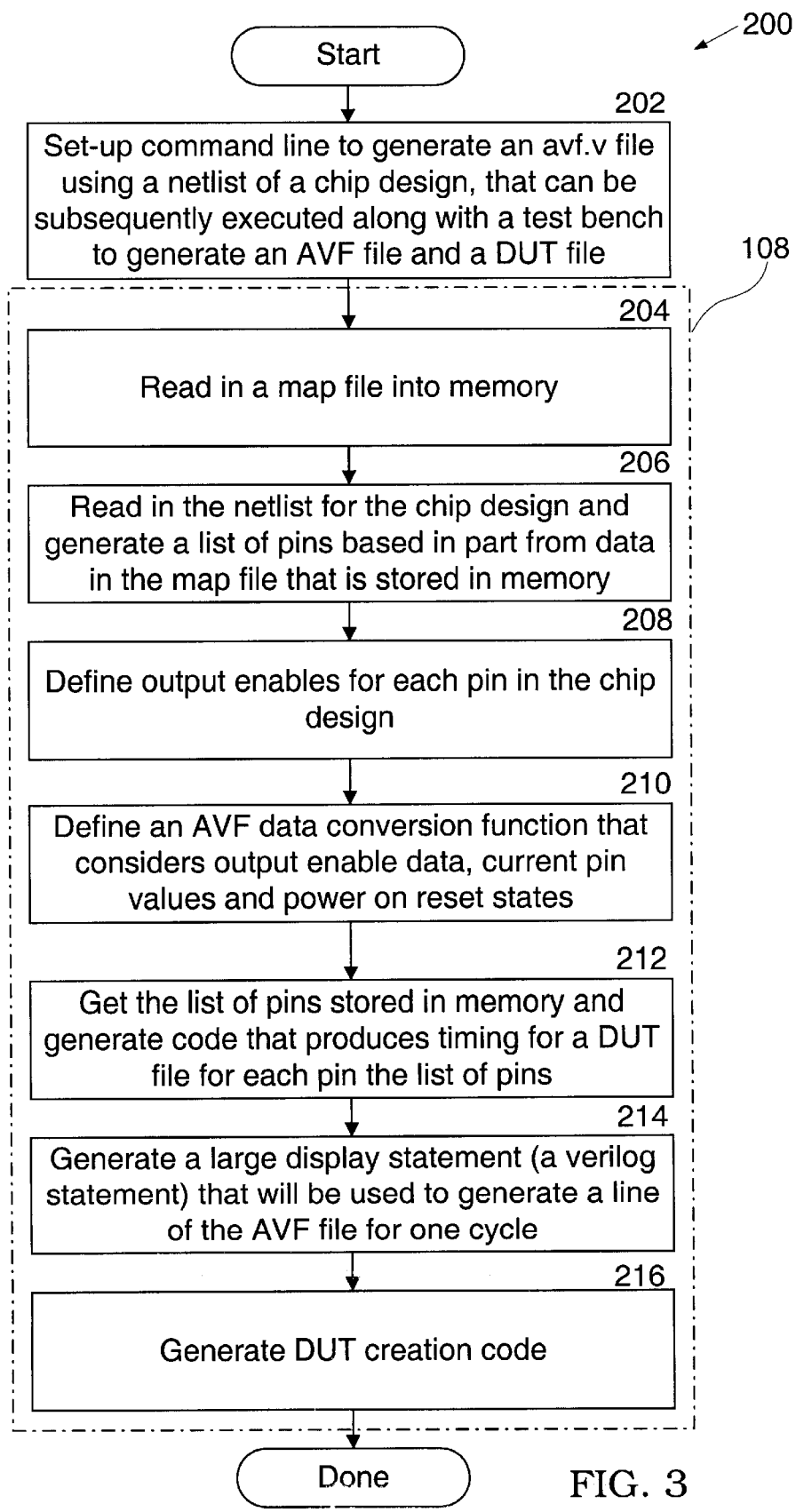
FIG. 3 illustrates a flowchart which illustrates the execution of the AVF generator (avfgen) that is configured to produce an avf.v file in accordance with one embodiment of the present invention.

FIG. 3 illustrates a flowchart 200 which illustrates the execution of the AVF generator that is configured to produce the avf.v file as described with reference to 108 of FIG. 2. Initially, the method begins at an operation 202 where the command line is set up to generate an avf.v file using a netlist of the chip design. As mentioned above, the avf.v file can then be subsequently executed along with a test bench in order to generate the desired AVF file and the DUT file.

Figures 4B, 4C:
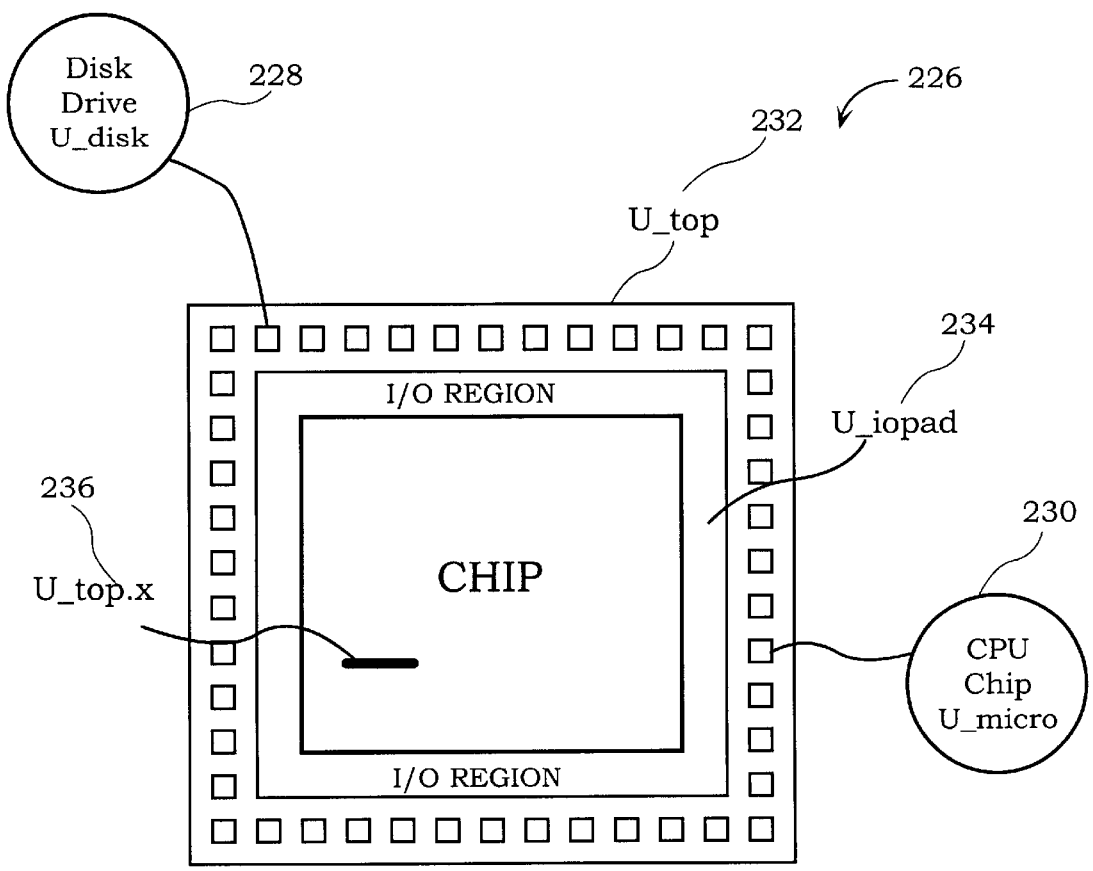
FIGS. 4B and 4C illustrate a more simplified example of a chip design and an associated command line entry in accordance with one embodiment of the present invention.

Setting up the command line generally entails typing in the correct data to enable running the AVF generator and a desired chip design, and its associated instantiations, map file, and netlist. FIG. 4A illustrates the typically commands that may be provided in a command line when it is desired to generate the avf.v file. As shown, a command line 202a is provided with a reference to avfgen and associated commands for running the AVF generator. The typical commands include, -V, -P, -O FILENAME, -M FILENAME, -N FILENAME, -T TOP INSTANCE, -I IOPAD INSTANCE, and -R RESET PIN NUMBER. These identifying commands will therefore assist the AVF generator in producing the proper avf.v file for the desired chip design and associated netlist. FIGS. 4B and 4C illustrate a more simplified example of a chip design 226 and an associated command line entry. For example, the chip design 226 includes associated instantiations for u_top 232, u_iopad 234, and u_top.x 236. These example instantiations identify some characteristics for this simplified chip design 226. Accordingly, the command line entry referenced in 202a of FIG. 3 for the simplified chip design 226 would read as shown in FIG. 4C.

Referring once again to FIG. 3, once the setup of the command line is completed, the method will proceed to execute the AVF generator to produce the avf.v file in operation 108. The generation of the avf.v file begins at an operation 204 where a map file is read into memory for the desired chip design. Next, the method will proceed to an operation 206 where the netlist for the chip design is read in order to generate a list of pins based in part from data in the map file that is stored in memory. Once the list of pins have been generated in operation 206, the method will proceed to an operation 208 where output enables for each pin in the chip design are identified.

The method now proceeds to an operation 210 where an AVF data conversion function is defined that considers output enabled data, current pin values, and power-on reset states. Once the AVF data conversion function has been defined in operation 210, the method will proceed to an operation 212 where the list of pins stored in memory are retrieved to generate code that produces timing for a DUT file for each pin in the list of pins. The method now proceeds to an operation 214 where a large display statement (i.e., a Verilog statement) is produced to enable the generation of a line of the AVF file for a particular cycle. In general, generating a display statement includes, performing a function call (for each pin) to the AVF data conversion table (i.e., FIG. 7B), and then taking the result from the function call and placing it into the proper entry location in the AVF file.

After the large display statement has been produced in operation 214, the method proceeds to an operation 216 where a DUT creation code is generated. As will be described below, the DUT creation code is configured to produce the DUT file once the avf.v file produced in 108 is executed along with the test bench. Once the DUT creation code has been generated in operation 216, the method of flowchart 200 will be done. As described above with reference to FIG. 2, the avf.v file 110b and other test bench files may then be executed to generate the AVF file 114, the DUT file 116, and the log file 118.

Accordingly, the avf.v file that is produced when the AVF generator is executed, may be used with any number of test files 110a and associated models 110b, in order to test the true functionality of the chip design under test. Reference may be made to Table B, which is an exemplary AVF file that may be generated once the test bench for a particular design is executed. Appendices B-1 through B-3 illustrates an exemplary DUT file 116 that may also be generated when the Verilog test bench executable files are executed.

FIG. 5A illustrates a flowchart 250 that identifies the method operations performed in generating a map file for a particular chip design in accordance with one embodiment of the present invention. The method begins at an operation 252 where cell types and their associated logical functionality are identified from the netlist of the chip design. Once the cell types and their associated logical functions have been identified, the method will proceed to an operation 254 where the method will proceed to a next multiple I/O cell in the netlist for the chip design.

Initially, the method will go to the first multiple I/O cell. Once at the first multiple I/O cell, the method will proceed to an operation 256 where the multiple I/O cell is formatted in an identifying statement. FIG. 5B illustrates one example of a multiple I/O cell that may be part of the chip design. In the example of FIG. 5B, an instance of an oscillator (u_OSC) is provided having a dataport 1 and a dataport 2. The multiple I/O oscillator is shown having a first pin and a second pin. The first pin is assigned pin number 34, and the second pin is assigned pin number 35. Dataport 1 of the first cell is shown having output enabled data .ned 1, and .neu 1. Dataport 2 is shown having output enabled data .ned 2 and .neu 1.

Therefore, for this exemplary multiple I/O cell of FIG. 5B, the identifying statement formatted in operation 256 is shown in FIG. 5C as 256'. This exemplary map file entry will therefore identify the oscillator as being a multiple I/O cell, which is part of the netlist. The method will now proceed to an operation 258 where it is determined if there is a next cell. If there is a next cell, the method will proceed to an operation 252 where the cell types and their associated logical functionality are identified. Now, the method will again proceed to operation 254 where the method will move to the next multiple I/O cell in the netlist for the chip design. Once the next multiple I/O cell in the netlist for the chip design is identified, it will be formatted in a proper identifying statement in operation 256. This method will therefore continue until there are no more multiple I/O cells in the netlist. At that point, the method of generating a map file 250 will be complete.

Figure 5D:
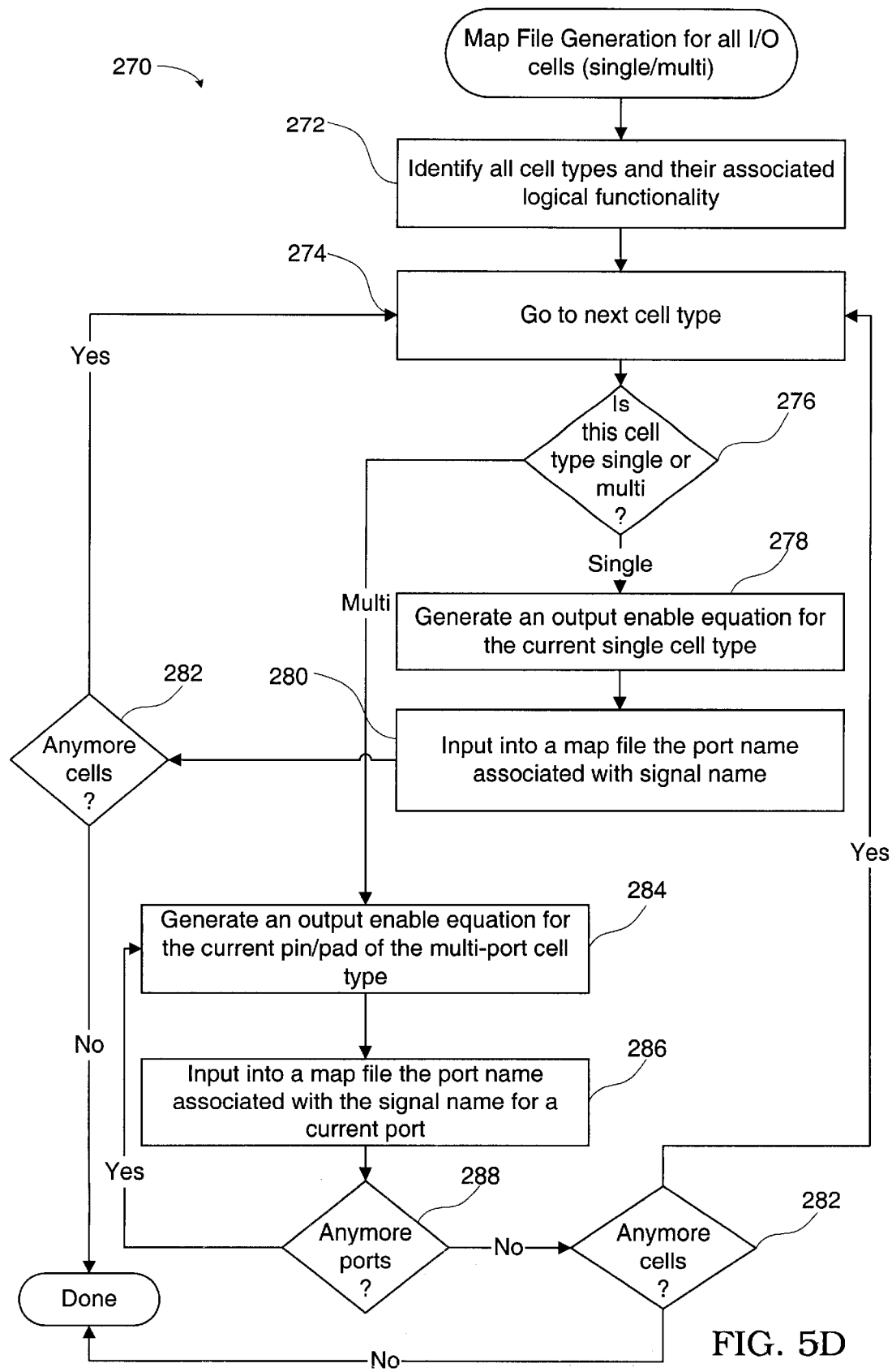
FIG. 5D illustrates the method of generating a map file for all I/O cells, including single and multi port cells, in accordance with one embodiment of the present invention.

FIG. 5D is a flowchart 270 illustrating the method operation performed in generating a map file for all I/O cells including single port cells and multi port cells, in accordance with one embodiment of the present invention. The method begins at an operation 272 where all cell types and their associated logical functionality are identified. Once all cell types have been identified, the method will proceed to an operation 274 where the method will proceed to a next cell type in the list of I/O cells. Initially, the method will begin with the first cell in the list of I/O cells. Then, the method will proceed to a decision operation 276 where it is determined whether the current cell is either a single port or a multi-port cell.

If the current cell is a single-port cell, the method will proceed to an operation 278 where an output-enable equation for the current single-port cell type is generated. Once the output-enable equation has been generated, the method will proceed to an operation 280 where the port name associated with the signal name is input into the map file. Specifically, this operation informs the program where to look for the signal name. This is needed because for each cell type, the signal name will be at a different port. Once operation 280 has been performed, the method will proceed to a decision operation 282 where it is determined whether there are anymore cells in the list of I/O cells. If there are no more cells, the method will be done. Alternatively, if there are more cells, the method will proceed back to operation 274.

Assuming now that the current cell in decision operation 276 is a multi-port cell, then the method will proceed to an operation 284. In operation 284, an output-enable equation will be generated for the current pin/pad of the multi-port cell type. Next, the method will proceed to an operation 286 where the port name associated with the signal name for a current port is input into the map file. Once the input has been performed for the current port, the method will proceed to a decision operation 288 where it is determined whether there are anymore ports in the current multi-port cell. If there are, operations 284 and 286 will be repeated for each port in the muti-port cell. Once all ports have been completed for the multi-port cell, the method will proceed to decision operation 282 where it is determined if there are anymore cells in the list of I/O cells. If there are, the method will again proceed back up to operation 274 where the next cell type will be identified. Alternatively, if it is determined in operation 282 that there are no more cells in the I/O cell list, the method will be done.

An example of the map file entries for single port and multi-port cells is shown in Table A below. Specifically, an example for a single port cell and a multi-port cell have been provided, including the output-enable equations and the pin names.

TABLE A

Exemplary Map File Entries For Single/Multi Port Cells

| Cell Type | Single/Multi | Output-Enable Equation | Pin Name |
|---|---|---|---|
| Single port cell ioej08 | S | "{NED} && {NEU}" | {PAD}; |
| : | : | : | : |
| Multi port cell ioaj06 | M | "!{OEN} && {SESEL}" "!{OEN}" | {PADP} {PADM}; |
| : | : | : | : |

Figure 6A:
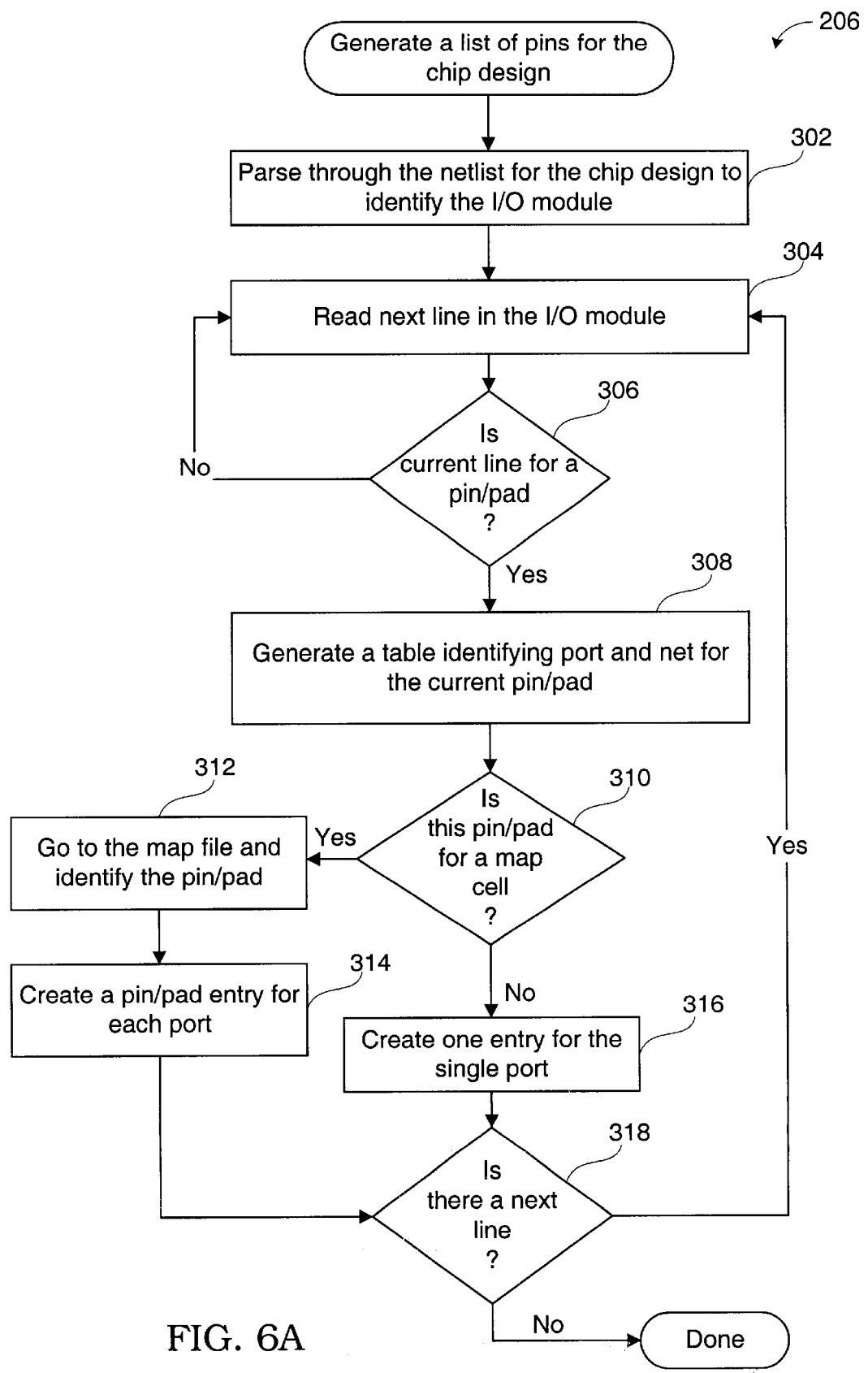
FIG. 6A illustrates an example of the method operations performed in generating a list of pins for the chip design in accordance with one embodiment of the present invention.

FIG. 6A illustrates an example of the method operations performed in generating a list of pins for the chip design in accordance with one embodiment of the present invention. Accordingly, flowchart 206 is a more detailed description of the method operations performed in operation 206 of FIG. 3. The method will begin at an operation 302 where parsing of the netlist of the chip design will be performed to identify the I/O module. FIG. 6B illustrates an example of a port/net table 302' of the netlist for the chip design that may be parsed through during operation 302. As shown, the exemplary table 302' identifies an instance, a cell type, a port and net for the enable information and the signal information, respectively. Once the I/O module has been identified in operation 302, the method will proceed to an operation 304 where the first line in the I/O module is read. Once the first line in the I/O module is read in operation 304, the method will proceed to a decision operation 306 where it is determined if the current line is for a pin or a pad (as used herein, the pin and pad terms are interchangeable).

Figure 6C:
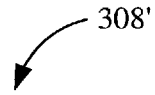

If it is not for a pin or a pad, then it is most likely some other type of logical gate. At that point, the method will proceed back to operation 304 where the next line in the I/O module is read. Once again, the method will proceed to decision operation 306 where it is determined if the current line is for a pin or a pad. When it is determined that it is for a pin or a pad, the method will proceed to an operation 308 where a table identifying port and net for the current pin or pad is generated. As shown in FIG. 6C, table 308' illustrates an example of the generated table for the port and net. The port will identify the output enable data (e.g., .neu, .ned, etc.), and net data will identify the signal data (e.g., signal 1, signal 2, etc.). In this embodiment, the generated table 308' of FIG. 6C will be generated for each line in the I/O module, and then erased from memory. The data in FIG. 6C therefore corresponds to PAD001 in FIG. 6B where the appropriate port and net data is illustrated. When the next line in the I/O module is read, table 308' will be generated anew for the current line.

From operation 308 in FIG. 6A, the method will proceed to a decision operation 310 where it is determined if the current pin or pad is associated with a map cell. As mentioned above, map cells are cells that have multiple I/O ports. If the current pin is for a map cell, the method will proceed to an operation 312 where reference will be made to the map file and the pin or pad is identified.

Figure 6D:
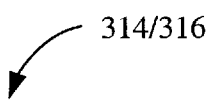

Once the pin or pad in the map file has been identified for the map cell, the method will proceed to an operation 314 where a pin or pad entry is created for each port. Reference is now drawn to FIG. 6D where an example of a port pin/pad entry table is provided. The entry table therefore identifies a port name, a pin or pad number, output enable data, and associated signals. For the exemplary multiple I/O cell of FIG. 5B, the port pin/pad entry table will have an entry for dataport 1, dataport 2, and its associated parameters. These entries will be made in operation 314 of FIG. 6A. On the other hand, if it is determined in operation 310 that the current pin or pad is not for a map cell, the method will proceed to an operation 316 where one entry for the single port is created. As an example, FIG. 6D illustrates a single entry for a pad having a pin or pad number 1 and its associated output enable data and signal data.

At this point, the method will proceed from either operation 314 or 316 to a decision operation 318. In decision operation 318, it is determined whether there is a next line in the I/O module. If there is, the method will proceed back to operation 304 where the next line in the I/O module is read. As mentioned above, an example of a simplified I/O module is shown in FIG. 6B. The method will then proceed filling-in the port pin or pad entry table of FIG. 6D until each line of the I/O module has been read and processed in FIG. 6A to generate a list of pins for the chip design.

Figure 7A:
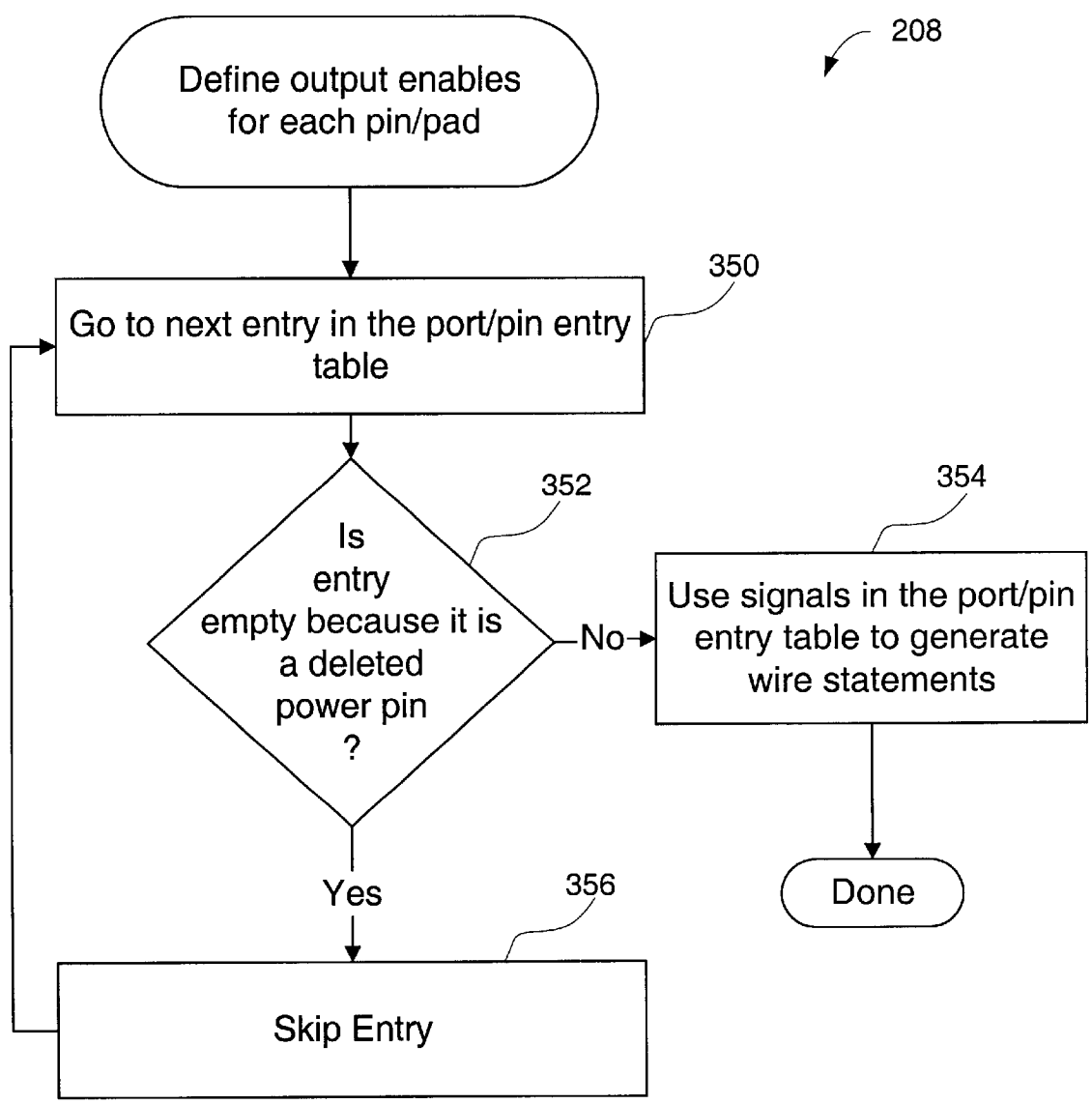
FIG. 7A illustrates a more detailed description of the sub-method operations of an operation of FIG. 3 where output enables are defined for each pin or pad in the chip design, in accordance with one embodiment of the present invention.

FIG. 7A illustrates a more detailed description of the method of operation 208 of FIG. 3 where output enables are defined for each pin or pad in the chip design. The method begins at an operation 350 where the method will go to a next entry in the pin or pad entry table of FIG. 6D, once it has been completed during the method operations of the flowchart of FIG. 6A. The method will now proceed to a decision operation 352 where it is determined whether the entry is empty because it is a deleted power pin. If it is a deleted power pin, the method will skip the entry in operation 356 and proceed back to operation 350. In operation 350, the method will go to the next entry in the port or pin entry table. Once it is determined that the next entry is not empty in operation 352, the method will proceed to an operation 354 where the signals in the port or pin entry table are used to generate wire statements. Exemplary wire statements, familiar to those skilled in the art are shown in Table D for completeness.

FIG. 7B illustrates an example of an AVF data conversion table which is defined in operation 210 of FIG. 3. As shown, the AVF data conversion table is used to determine what the AVF data is supposed to be depending upon the power-on reset information, the output enable information, and the value for each pin in a particular cycle.

Figure 8A:
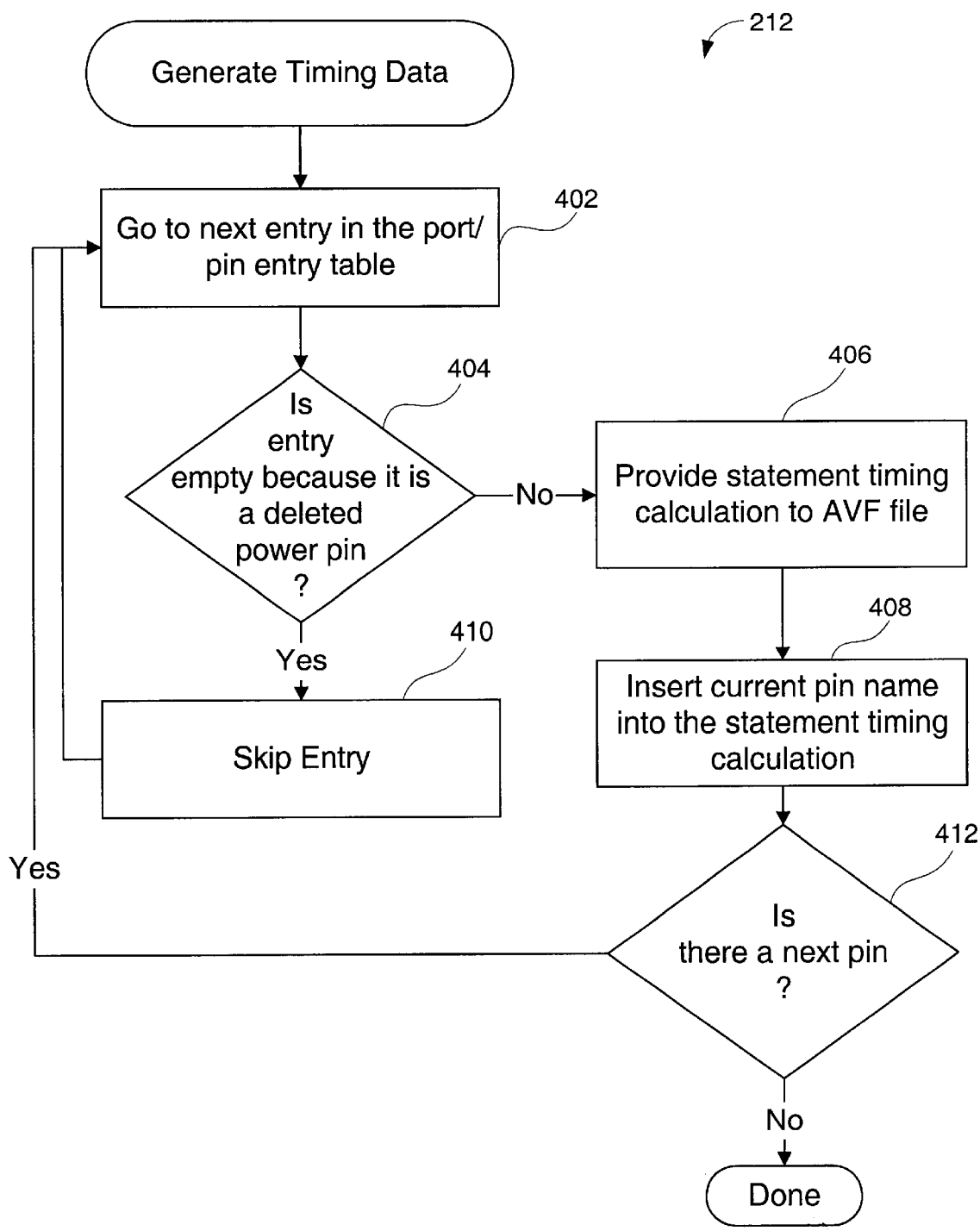
FIG. 8A illustrates the method operations performed when timing data is generated for the production of the DUT file in accordance with one embodiment of the present invention.

FIG. 8A illustrates the method operations performed when timing data is generated for the production of the DUT file. The method begins at an operation 402 where the method proceeds to the next entry in the port or pin entry table which was defined in FIG. 6D. In operation 404, it is determined whether the entry is empty because it is a deleted power pin. If it is a deleted power pin, the method will proceed to an operation 410 where the entry is skipped and the method will proceed back to operation 402. When it is determined that the current entry in the port or pin entry table is not deleted, the method will proceed to an operation 406 where a statement timing calculation is provided to the AVF file.

Next, the method will proceed to an operation 408 where the current pin name is inserted into the statement timing calculation. FIG. 8B provides an exemplary statement timing calculation in accordance with this embodiment. At this point, the method proceeds to a decision operation 412 where it is determined if there is a next pin in the entry table. If there is, the method will again proceed to operation 402. If there are no more pins in the entry table, the method will be done.

Figure 9:
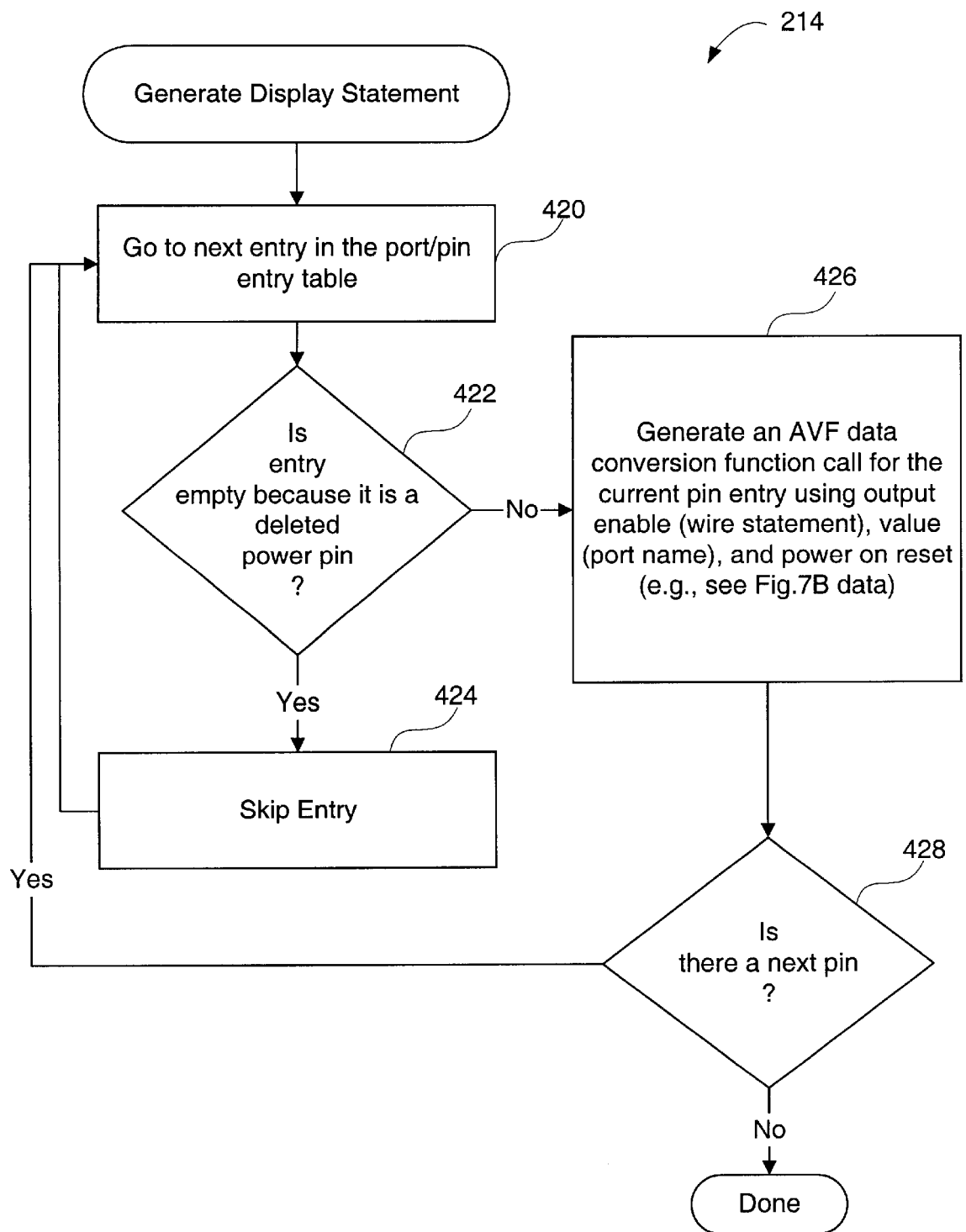
FIG. 9 illustrates a more detailed flowchart diagram of the method operations performed in FIG. 3 when generating a display statement in accordance with one embodiment of the present invention.

FIG. 9 illustrates a more detailed flowchart diagram of the method operations performed in 214 of FIG. 3 when generating a display statement in accordance with one embodiment of the present invention. The method begins at an operation 420 where the method moves to the next entry in the port/pin entry table. The method now moves to an operation 422 where it is determined if the entry is empty because it is a deleted power pin. If it is, the method proceeds to an operation 424 where the entry is skipped and the method moves to operation 420. Once it is determined that the entry is not empty because it was not a deleted power pin, the method will proceed to an operation 426.

In operation 426, an AVF data conversion function call is generated for the current pin entry using output enable data (wire statements), value data (port name), and power-on reset data. Reference should be made to the exemplary output enable data, value data, and power-on reset data provided in the table of FIG. 7B. The AVF data conversion function call is essentially the call that will generate AVF data similar to the AVF file illustrated in Table B, once the avf.v file along with the test bench (which are Verilog executables) are executed. Next, the method proceeds to an operation 428 where it is determined if there is a next pin. If there is a next pin, the method will proceed back to operation 420. From operation 420, the method will again proceed to decision operation 422 and then to skip the current entry 424 if the entry is empty because it is a deleted power pin. If it is not a deleted power pin, the method will again proceed to operation 426 and then back to operation 428. Once there are no more pins, the method will be done.

B. AVF Vector Data Verification Loop

Figure 10:
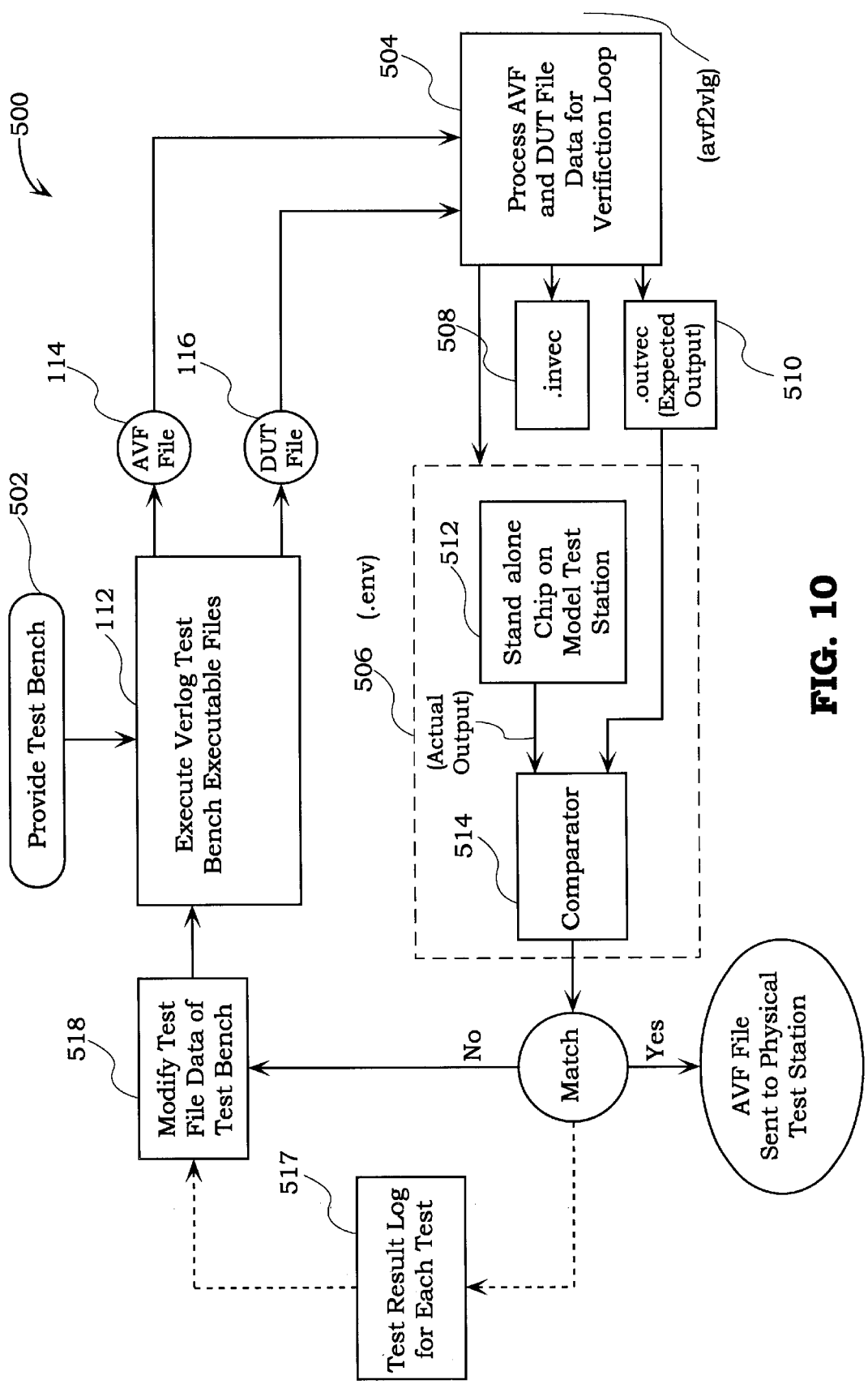
FIG. 10 illustrates a flowchart diagram of an AVF test vector verification loop in accordance with one embodiment of the present invention.

FIG. 10 illustrates a flowchart diagram of an AVF test vector verification loop 500 in accordance with one embodiment of the present invention. As discussed above, the verification loop is performed to substantiate the correctness of the generated AVF file data and the DUT file data that has just been generated. By executing this verification loop, the generated AVF file data and the DUT file data are used to generate input vector data and expected output vector data. The input vector data is then provided to a digital model of the test station having a model of the chip design under test. The input test vector is then feed to the model test station, which then generates an output that is compared with an expected output. If the output from the model test station matches the expected output, then the AVF file data and the DUT file data will be ready for use in the physical test station.

Reference is again made to FIG. 10, where the verification loop begins at an operation 502 and a test bench is provided. As discussed with reference to FIG. 2 above, the test bench typically includes the generated avf.v file 110b, test files 110a, the netlist for the chip design being tested 110c, and models 110d. Therefore, once the test bench is provided, the test bench files are executed in 112 to generate the AVF file 114 and the DUT file 116.

However, to ensure that the generated AVF file 114 and DUT file 116 are accurate once they are provided to the physical test station, they are processed through the verification loop. In this process, the AVF file 114 and the DUT file 116 are provided to a block 504 (e.g., avf2vlg) where the AVF file and the DUT file are processed for use in the verification loop. During the processing, input test data (.invec) 508, output test data (.outvec) 510, and an .env file 506 (e.g., which is an environment file) are produced. In general, the .invec 508 is provided to the .env file 506 which has information about a model of a standalone chip which is simulated on a model test station 512. The .outvec 510 is essentially the expected outputs that should be generated once the .env file 506 is executed.

Once the .env 506 is executed, an actual output will be provided to a comparator 514. The .outvec 510, which is the expected output, is also provided to the comparator 514. If the expected output and the actual output match, then the AVF file is ready for use in the actual physical test station. However, if a match is not produced by the comparator 514, the loop will continue to a block 518 where the test file data of the test bench is modified to fix any timing errors that may have caused the "actual output" to not match the "expected output."

After the modification to the test file has been performed, the loop will again cause the test bench to be executed to generate another AVF file 114 and another DUT file 116. The AVF test vector verification loop 500 will therefore continue to be processed (if desired by the test engineer, because less than a perfect match may be acceptable in certain cases) until the comparator 514 determines that the actual output coming from the standalone chip on the model test station 512, matches the expected output from the .outvec 510. At that point, the AVF file should function properly with the actual physical test station hardware and properly test the integrity of the chip design being tested. In another embodiment, each time a test of the test files is run, the results of the verification are provided to a test result log 517 (which may be a long log of all of the run tests). In one embodiment of the present invention, a test engineer can examine the test result log 517 and determine if the verification loop should be run again after modifications are made to the test file data of the test bench.

It should also be noted that because the standalone chip on the model test station is actually a computer model of the test station, complete test coverage testing can also be performed during the model testing stage. As can be appreciated, this a substantial advance in the art.

Figure 11A:
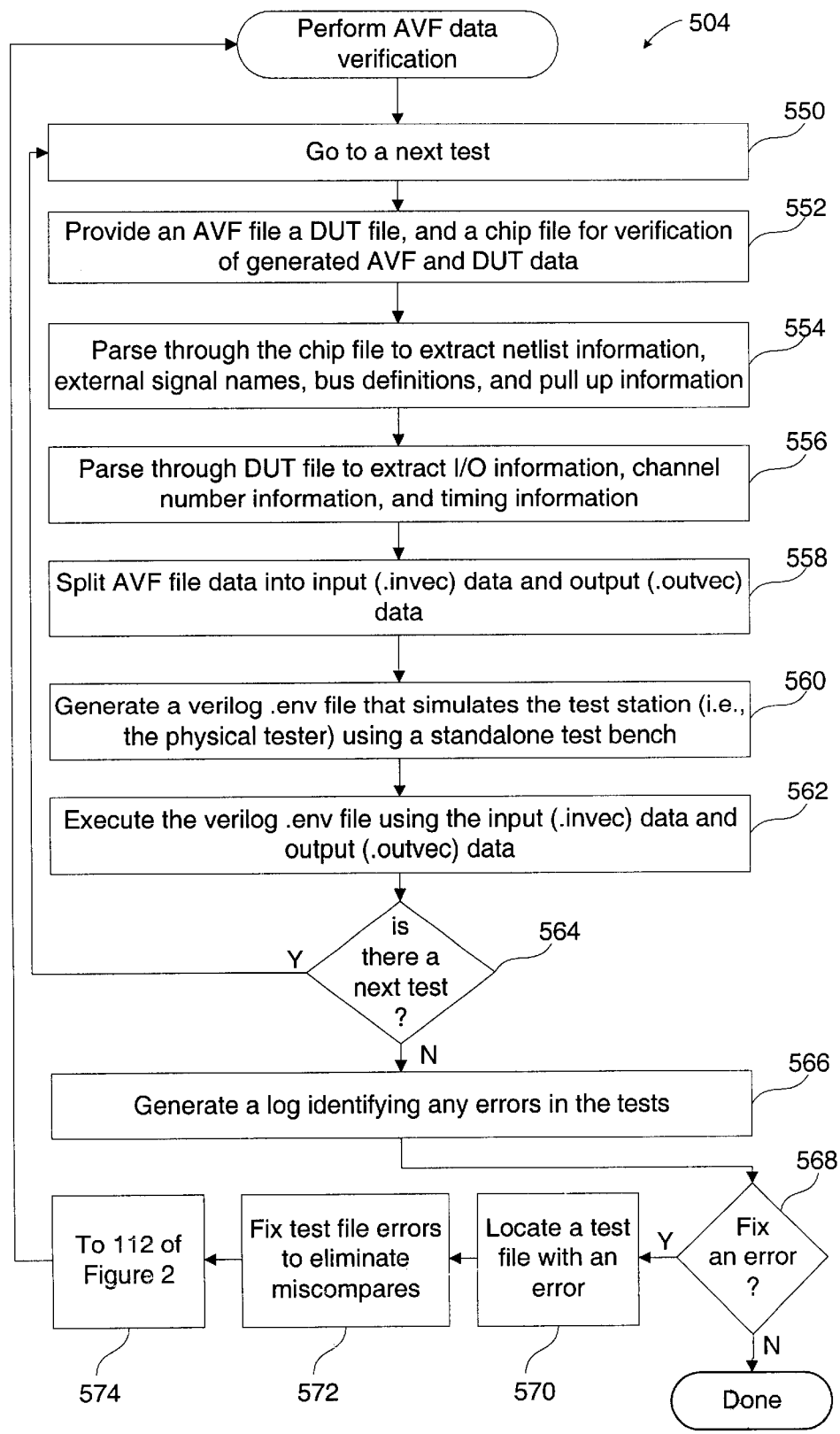
FIG. 11A illustrates a flowchart identifying the operations performed during AVF data verification in accordance with one embodiment of the present invention.
Figure 11B:
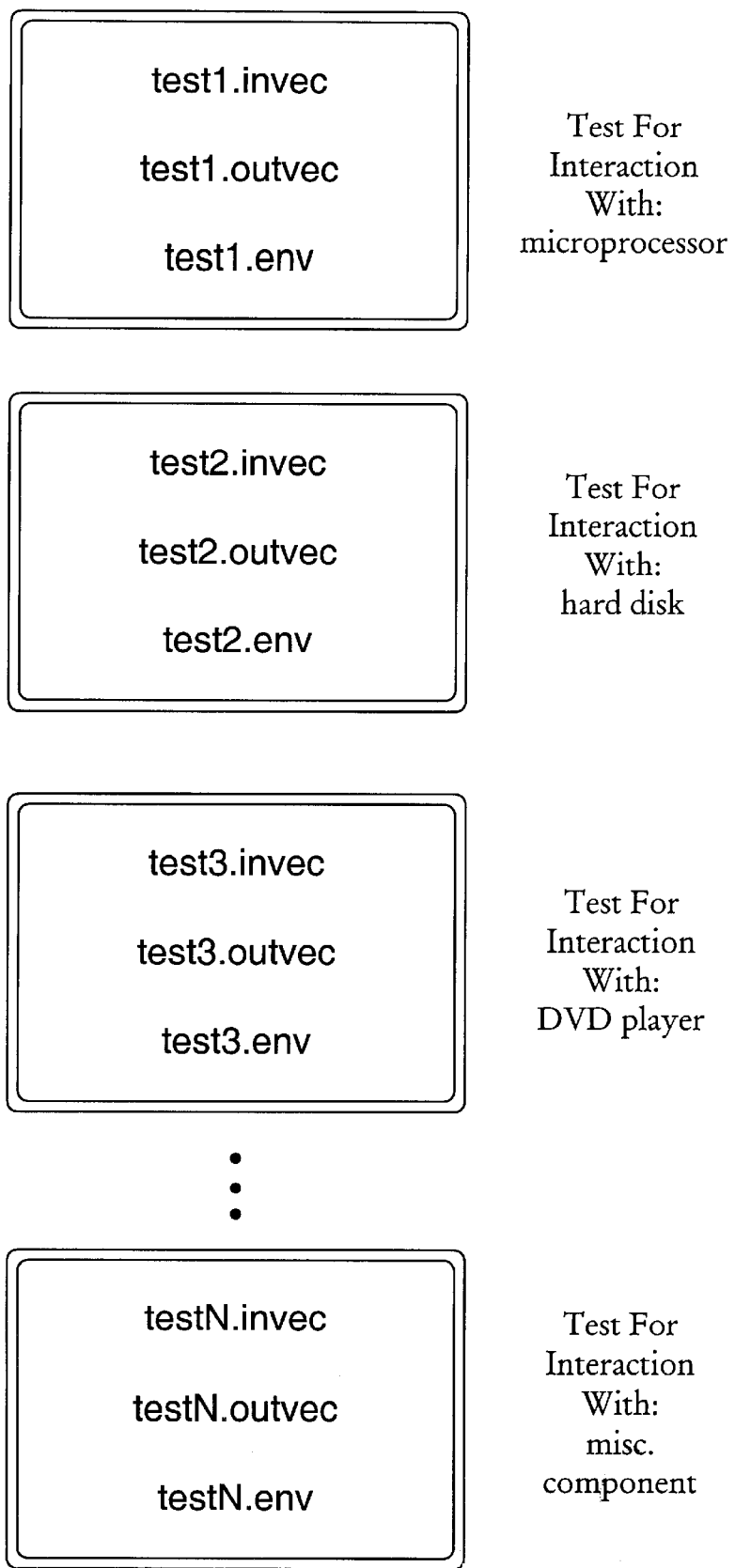
FIG. 11B illustrates pictorial examples of a multitude of tests that may be run as part of the test files in order to stimulate the chip design under test, in accordance with one embodiment of the present invention.

FIG. 11A illustrates a flowchart 504 identifying the operations performed during AVF data verification in accordance with one embodiment of the present invention. The method begins at an operation 550 where the method will go to a first test that is identified in the test files 110a in a particular test bench. Thus, FIG. 11B illustrates a plurality of tests which may be run during verification of the AVF data. For example, a first test may include a test 1.invec file, a test 1.outvec file, and a test 1.env file. The first test may be, for example, to test the interaction of the chip design with a given microprocessor. A second test may be to test the interaction of the chip design with a hard disk drive. A third test may be to test the chip design's interaction with a DVD player. Of course, the test files 110a may include many more tests in the range of hundreds or even many thousands of different tests to test the interaction of the chip design with its expected real world stimulation when the packaged chip is used for its intended purpose.

Reference is again drawn to FIG. 11A where the method continues in operation 552 where an AVF file and a DUT file is provided, and a chip file for the verification of generated AVF and DUT data is made available. Reference may be made to Table E which identifies an exemplary chip file. The chip file includes an identification of a netlist, pullup data, external signal names (e.g., chip wiring to external components), and bus declarations. Once the AVF file, the DUT file, and the chip file have been provided for verification in operation 552, the method will proceed to an operation 554. In operation 554, the method will parse through the chip file to extract netlist information, external signal name information, bus definition information, and pullup information.

Once the parsing through the chip file has been completed, the method will proceed to an operation 556 where a parsing through the DUT file to extract I/O information, channel member information, and timing information is performed. As mentioned above, an exemplary DUT file is shown in Appendices B-1 through B-3. The method then proceeds to an operation 558 where the AVF file data is split into input data (.invec), and output data (.outvec). After the AVF data has been split, the method will proceed to an operation 560 where a Verilog .env file is generated that simulates the test station (i.e., the physical tester) using a standalone test bench. The standalone test bench will basically include the netlist for the chip design being tested.

Next, the method will proceed to an operation 562 where the Verilog .env file is executed using the input data and the output data. With reference to FIG. 10, the .env file 506 is executed using the standalone chip on the model test station 512, including the comparator 514. Once executed, a determination is made as to whether the expected output matches the output from the standalone chip on the model test station. At this point, the method will proceed to a decision operation 564 where it is determined if there is a next test. As shown in FIG. 11B, there are typically many more tests that are run during the verification stage.

Accordingly, for the next test, the method will proceed back up to operation 550 where the method will go to the next test. Once it is determined that there are no more tests, a log is generated identifying any errors in the tests in operation 566. At this point, the test engineer can analyze the generated log to determine if any of the errors should be fixed in operation 568. If fixing the errors is desired, the method will proceed to an operation 570 where a test file having a particular error is located. Once the test file is located, the method will proceed to operation 572 where the test file errors are fixed to attempt to eliminate miscompares. Once the test file errors have been fixed, the method will proceed to operation 574 where the method will return to operation 112 of FIG. 2, where the test bench is executed. The execution of the test bench is also pictorially shown in FIG. 10.

At that point, a new AVF file and DUT file are generated, and verification of the AVF data can again be performed, if desired. Alternatively, if it is determined in operation 568 that there are no errors to fix, it will be assumed that the execution of the .env file produced actual outputs from the standalone chip on the model test station that matched the expected outputs. In that case, the method will be done. At the same time, if the errors are such that further verification is not desired, the method will also be done from the determination of operation 568.

Figure 12:
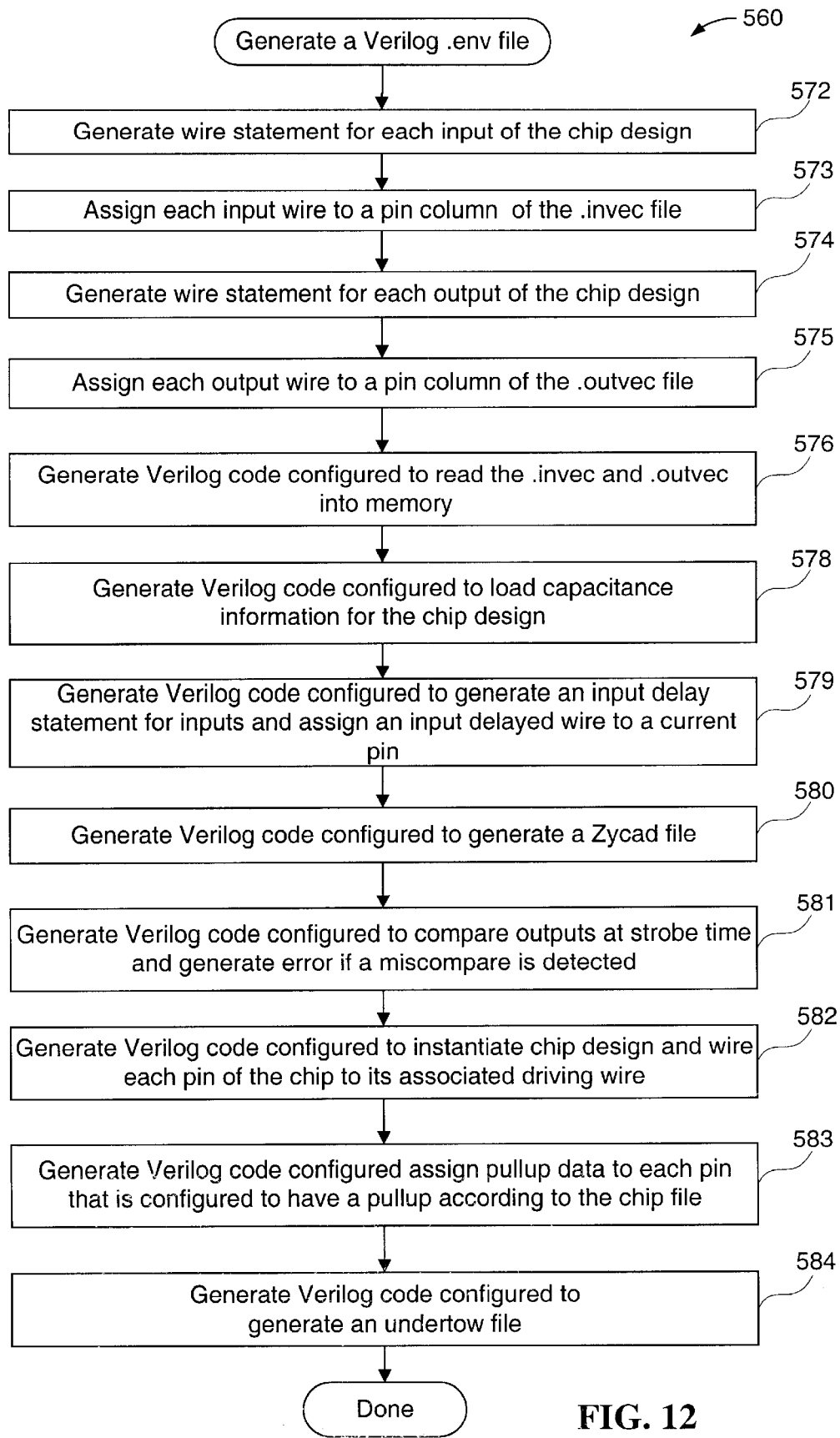
FIG. 12 illustrates a flowchart that describes the generation of a Verilog environment file that is subsequently executed in an operation of FIG. 11A, in accordance with one embodiment of the present invention.

FIG. 12 illustrates a flowchart 560 that describes the generation of a Verilog .env file that is subsequently executed in operation 562 of FIG. 11A. The method of generating a Verilog .env file begins at an operation 572 where wire statements for each input of the chip design are generated. Next, the method will move to an operation 573 where each input pin is assigned to a pin column of the .invec file. In general, the .invec file is arranged in a memory array having columns for each pin in the chip design, and a row number for each cycle in a test. Next, the method will proceed to an operation 574 where wire statements for each output of the chip design is generated.

Once wire statements have been generated, the method will proceed to an operation 575 where each output wire is assigned to a pin column of the .outvec file. The method now proceeds to an operation 576 where Verilog code configured to read the .invec and .outvec data into memory is generated. Once that set of code is generated, the method will proceed to an operation 578 where Verilog code configured to load capacitance information for the chip design is generated. As is well known, the chip wiring has particular capacitance for the various wires that should be approximated during the modeling of the chip design in order to approximate the actual true physical chip design circuit. Next, the method will proceed to an operation 579 where Verilog code configured to generate an input delay statement for inputs is generated. Verilog code is also generated to assign an input-delay wire to a current pin. An example of an input-delay wire is shown below.

wire #delay signalname_drv=signalname_input

Typical input-delay statements of the present invention can handle non-return to 0, return to 1, and return 0 statements. In the above example, each time the "signalname_input" changes, the "signalname_drv" will also change after a given "delay" that is specified in the input delay wire statement.

The method will then proceed to an operation 580 where Verilog code configured to generate a Zycad file is generated. The Zycad file is a fault creating file that applies inputs and can determine what amount of test coverage is achieved during a particular test. This test coverage testing will, therefore, closely if not identically, approximate the test coverage achieved in the true integrated circuit device being tested on the physical test station.

From operation 580, the method will proceed to an operation 581 where Verilog code configured to compare outputs at a strobe time and generate an error if a miscompare is detected, is generated. In this exemplary design, the strobe is set for 90 percent of a given cycle. Next, the method will proceed to an operation 582 where Verilog code configured to instantiate the chip design and wire each pin of the chip to its associated driving wire, is generated.

At this point, the method will proceed to an operation 583 where Verilog code will assign a pullup to each pin that is configured to have a pullup according to the chip file, is generated. Once the pullup information has been configured, the method will proceed to an operation 584 where Verilog code configured to generate an undertow file is generated. An undertow file is one that can be executed using a well known undertow program that enables computer graphical inspection of signals to facilitate debugging of errors. At this point, the method will be done. As mentioned above, the .env file generated in flowchart 560 is then subsequently executed along with the standalone chip on the model test station and the .invec data to determine whether the output produced from the standalone chip on the model test station will match the expected output (i.e., .outvec).

If a match is achieved, the AVF file data and the DUT file data will be considered to be appropriate for running on the physical test station. However, if the comparison determines that the actual outputs do not match the expected outputs, a test log will be generated for each of the files identifying where errors in comparisons were detected. At that point, the test engineer can decide whether further loops through the AVF test vector verification loop 500 of FIG. 10 should be executed in order to produce a suitable AVF file for use on the physical test station.

C. Automated Testing of Alternating Current Characteristics

Once the AVF files and the DUT files have been generated as described above, and verified through the verification loop of FIG. 10, additional embodiments of the present invention will enable an automated technique for testing alternating current (AC) characteristics of a part. This testing is generally performed via software, which is configured to test a digital model of the part (i.e., integrated circuit design), and then produce a report indicating results from the testing. These results therefore provide comprehensive data regarding the behavior and signal interaction being tested. The results can then be used by a test engineer to verify results obtained via testing of the part on the physical tester.

Although there are many types of tests that can be run on parts to ascertain their AC performance, the following examples will be illustrative of setup and hold testing, pulse width testing, and out-to-out testing. Therefore, reference is initially made to FIG. 13A, in which several signals are shown having different transition times. A signal 690 may represent a data strobe signal (Signal 1), such as a clock signal. The signal 692 (Signal 2), which is depicted below signal 690 is shown having a transition from low-to-high. The signal 694 (Signal 2) is shown transitioning at a later time from low-to-high. In setup and hold testing, the goal is to prevent Signal 2 from transitioning from low-to-high or high-to-low when the data strobe Signal 1 transitions. To facilitate understanding, FIG. 13B illustrates a standard D Flip Flop 696, which has Signal 2 at the data port D, and Signal 1 at the clock port.

When it is desired to read data stored in the D Flip Flop 696, the Signal 2 must either be HIGH or LOW. Thus, it is desired that no transition 695 occur during a T setup time 691 and a T hold time 693, otherwise, the D Flip Flop will not be able to output from Q the correct data level of HIGH or LOW. To identify what the T setup time 691 and T hold time 693 are, the software program of the present invention will enable testing of a model part to ascertain the most optimum times (i.e., setup and hold timing). In other words, the program is configured to incrementally move the transition times of the Signal 2 in order to identify when a failure occurs. When a failure occurs at a particular moved transition time, those failure points in time will be indicative of a T setup time 691 or a T hold time 693.

The setup and hold testing is also generally used to determine whether two parts will be able to communicate with one another (i.e., to meet interfacing requirements). If communication fails, the part may have to have a larger setup and hold time. Thus, this type of testing will enable testing of a list of setup and hold times of a particular part, and then determine whether the part tested for setup and hold will be able to communicate with another part having its own list of setup and hold times. Before testing is performed on the part, however, the list of expected setup and hold times will already exist (i.e., desired values), and the testing enables verification of those pre-set setup and hold times. If those pre-set times fail, a new setup and hold time will be marked for those times in which failures occurred.

Figure 13C:
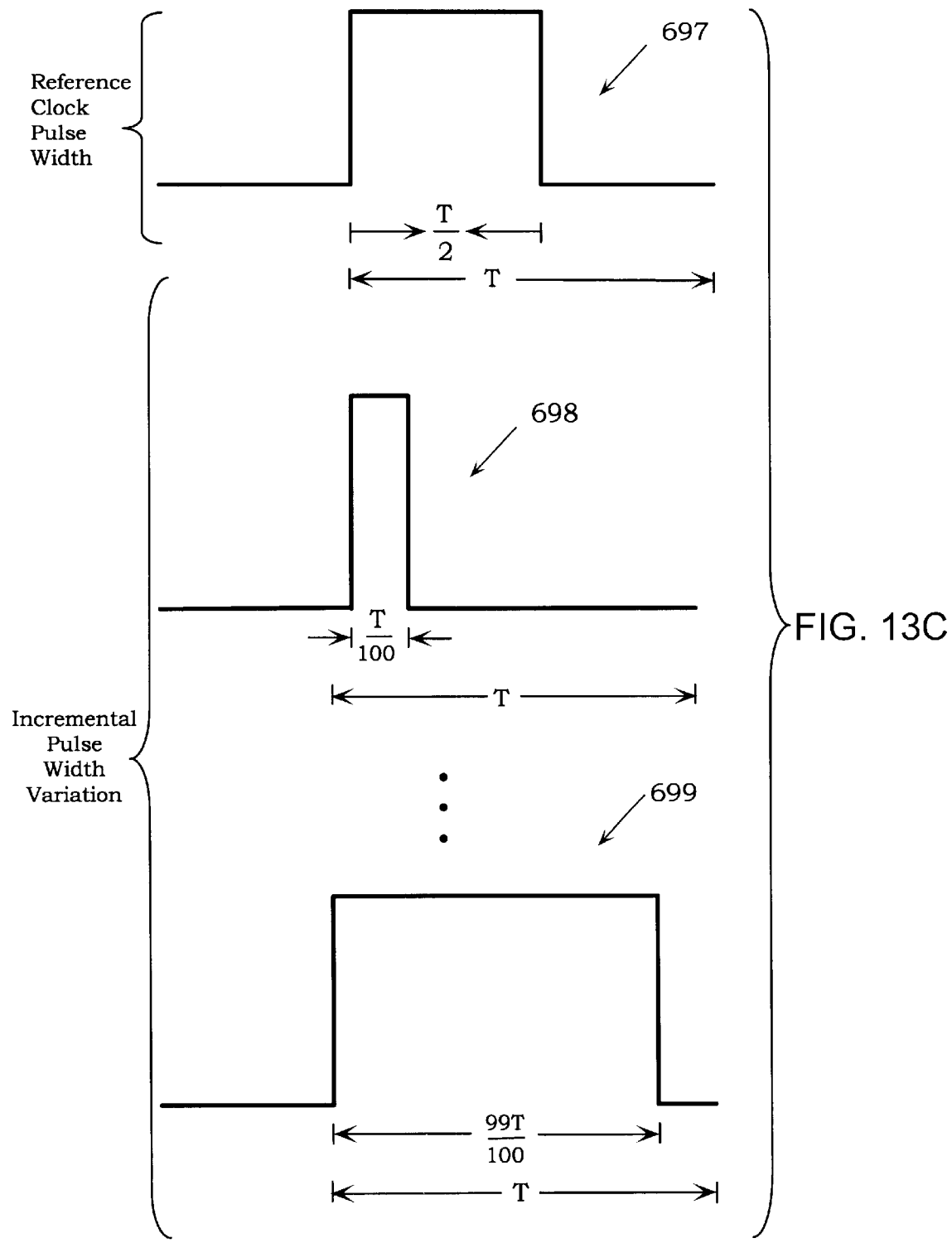

Another test is that of pulse width. A simplified example of pulse width testing is shown in FIG. 13C, wherein a reference clock pulse width 697 is provided having an exemplary 50% duty cycle. The pulse width is then varied in an exemplary range between an about 1% duty cycle to an about 99% duty cycle, for pulse widths 698 and 699, respectively. For example, if the period is 200 ns, a 50% duty cycle is 100 ns, a 1% duty cycle is about 2 ns, and a 99% duty cycle is about 198 ns. The variation in duty cycle (i.e., pulse width variations) will, in this embodiment, be performed incrementally. This incremental variation will enable the detection of when the part being tested stops behaving in the intended manner.

Yet another test is that of out-to-out measurement. In general, out-to-out measurement testing is configured to ascertain what the time is between two transitioning signals. When these time parameter are ascertained for all of the signals of a given part, this data can be provided to manufacturers of other parts so they can determine whether their part is capable of interfacing with the part being tested. Thus, the data sheet for a part may identify times between consecutive output signals (i.e., provide a time between an output signal 1 and another output signal 2).

Now that exemplary test parameters have been discussed, the following flowcharts should be studied in conjunction with the figures and tables to fully understand the software method operations that are performed in order to automate the AC testing methodologies used to comprehensively characterize a given part under test. As discussed above, however, this testing is done a digital model, before the physical part is tested on the physical test station. The results of these model tests can therefore be used to a substantial advantage because it allows the test engineer running the physical test station to verify the results subsequently obtained on the physical part.

Figure 14:
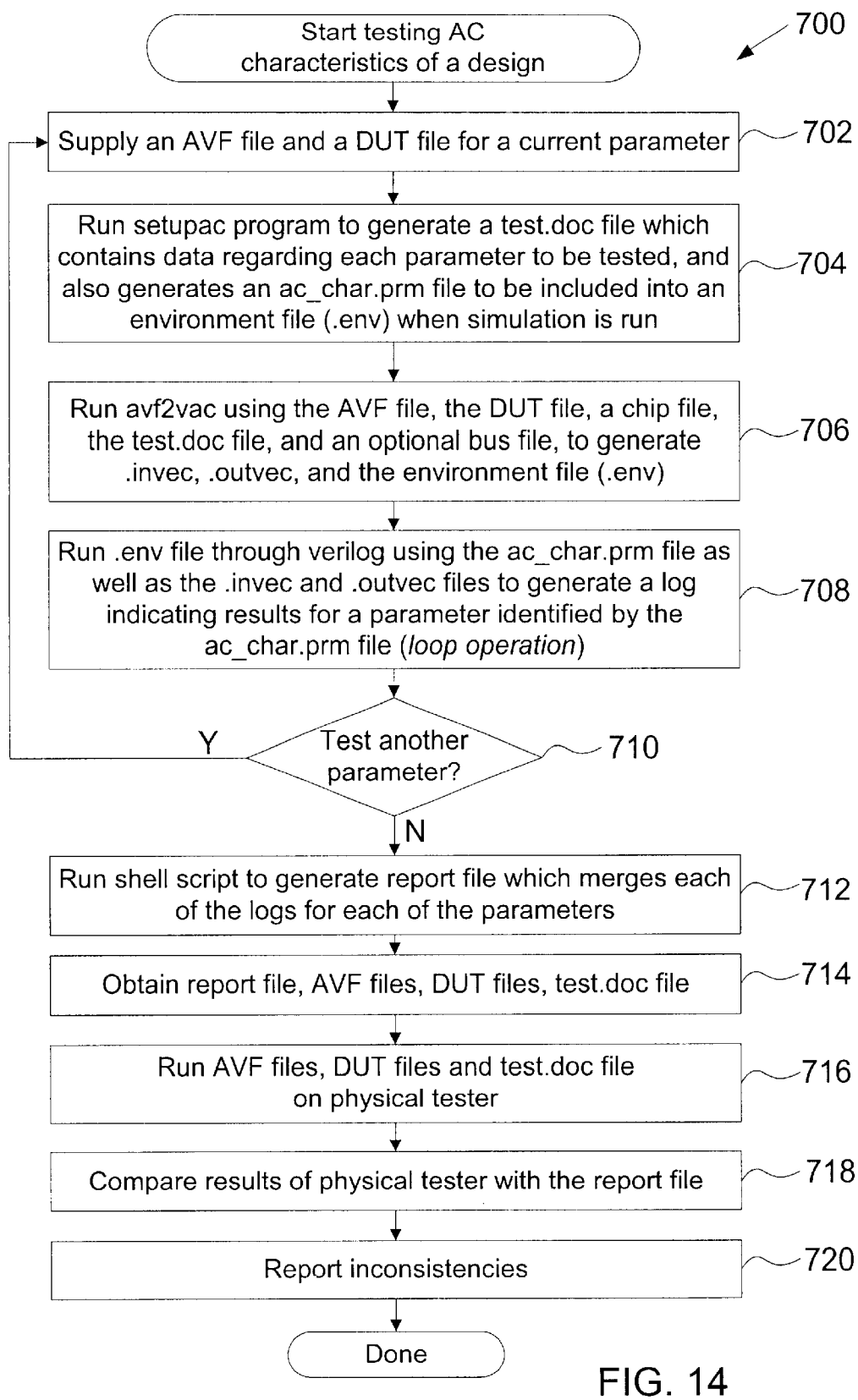
FIG. 14 illustrates an overview flowchart diagram depicting the method operations performed in testing alternating current (AC) characteristics of a given integrated circuit design, in accordance with one embodiment of the present invention.

FIG. 14 illustrates an overview flowchart diagram 700 depicting the method operations performed in testing alternating current (AC) characteristics of a given integrated circuit design, in accordance with one embodiment of the present invention. The method begins at an operation 702 where an AVF file and a DUT file for a current parameter is supplied. As described above, the AVF file and the DUT file can be, in accordance with the present invention, automatically generated and then made available for testing. The method now proceeds to an operation 704 where a setupac program is run to generate a test.doc file which contains data regarding each parameter to be tested, and also generates an ac_char.prm file that will be included into an environment file (.env) when a simulation is run. In general, the setupac program is composed of code that is configured to ask a user a selected number of questions and place any response to those questions in a format that the AVF2VAC program can read once it is run in operation 706. The test.doc file generally contains parameters that are to be measured in order to complete the AC characterization tests, such as setup and hold, pulse width, and out-to-out measurements.

After the setupac program has been run in operation 704, the method will proceed to an operation 706. In operation 706, an AVF2VAC program is run using the AVF file, the DUT file, a chip file (e.g., see Table E), the test.doc file, and an optional bus file, to generate .invec, .outvec, and the environment file (.env). At this point, the method will proceed to an operation 708 where the .env file is run through Verilog using the ac_char.prm file as well as the .invec and .outvec files to generate a log indicating results for a parameter identified by the ac_char.prm file.

The method operation of 708 will therefore be run in a loop several times in order to define data points at which a failure occurs during a test operation for each parameter. For example, during the run of the .env file through verilog using the ac_char.prm file as well as the .invec and the .outvec files, a log for that particular parameter, such as the pulse width parameter, will be produced. However, in order to determine the data points at which a failure occurs for a given parameter, the .avf file must be run in a loop such that each time it is run, it will change the DUT timing in order to detect the given failure. Therefore, initially, it will begin with an initial value for each of the signals of a given parameter.

At that point, the Verilog code will be run and if an error occurs, that will be the data point that will be input into the log for that parameter. However, if no error occurs during that run of the loop performed in operation 708, another run will be performed with the values for the parameter being incremented in order to determine whether a failure will occur for this new increment. If no failure occurs, then the DUT timing will be changed again, and the values for the signals of the parameter will be incremented to determine if there will be a failure at that given increment. Once a log entry is made for that given parameter being tested, the method will proceed from operation 708 to a decision operation 710.

In decision operation 710, it is determined whether testing another parameter is desired. If it is determined that another parameter is to be tested, the method will proceed back up to operation 702 where a different AVF file and DUT file is used for that current parameter. The current parameter, of course, will consist of two signals which will be tested during the run of the .env file in operation 708. Accordingly, if it is now determined that the current parameter will be for testing setup or hold of two given signals that make up the parameter, the method will proceed down through operation 704, 706, and then to 708. In operation 708, the method will proceed to run through a loop that increments the values of each of the signals until the proper setup and hold times are detected and then input into a log. In general, the proper setup and hold times will be detected once a failure occurs at a given setup and hold time.

Once again, the method will proceed to an operation 710 where it is determined whether testing of another parameter is desired. If testing of another parameter is desired, the method will proceed back to operation 702 and then proceed through to operation 708. In operation 708, the parameter that is being tested may be for testing out-to-out AC characteristics. During the testing of out-to-out AC characteristics, the method operation of 708 will run through the loop in order to determine what the proper out-to-out data points are for the given parameter. Once it is determined that no more parameters will be tested, the method will proceed to an operation 712.

In operation 712, a shell script is run in order to generate a report file which merges together each of the logs for each of the parameters that were tested. The operator of a physical test station may then obtain the report file, the AVF files, the DUT files, and the test.doc file used during the testing in order to verify these test results on the physical part during testing on the physical test station. The test engineer running the physical test station may obtain the report file, the AVF files, the DUT files, and the test.doc file from the company network file server, a digital diskette, or any other suitable medium in order to begin testing on the physical part.

The method then proceeds to an operation 716 where the AVF files, the DUT files, and the test.doc files are run on the physical tester by the test engineer. At that point, the results from the physical tester can be compared to the results obtained and documented in the report file in operation 718. The test engineer can then report any inconsistencies in operation 720 and perform any necessary modifications in order to correct inconsistencies or document inconsistencies for later use. At that point, the automated method of performing AC characteristic testing of a circuit design will be done.

Figure 15:
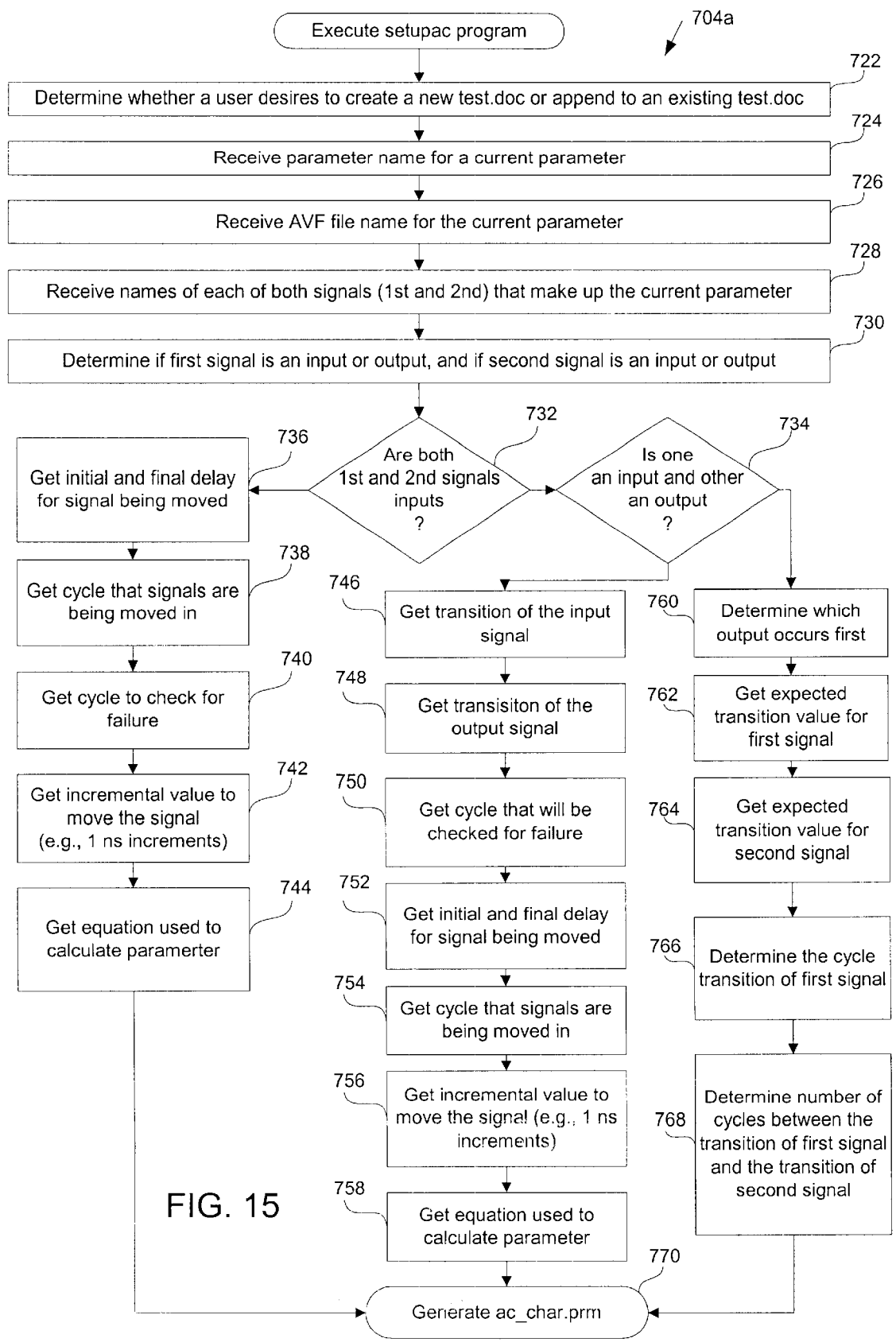
FIG. 15 illustrates the method operations performed during the execution of the setupac program described above, in accordance with one embodiment of the present invention.

FIG. 15 illustrates the method operations performed during the execution of the setupac program described above in operation 704, in accordance with one embodiment of the present invention. The method operations 704a therefore begin at an operation 722. In operation 722, the method determines whether a user desires to create a new test.doc file (also referred to as a test file) or append to an existing test.doc file. In general, the user is provided with the option of appending to an existing test.doc file in order to avoid having to input data to each of the questions posed by the setupac interview program, which is implemented to generate an initial test.doc file when only a minor edit or variation is made after a prior initial run is performed.

However, the user should generally generate a first test.doc file by marching through the interview questions for a particular design and then use an append feature if minor variations are made at a later point to the existing test.doc file. Initially, it will be assumed that the user will create a new test.doc file in operation 722. In operation 724, the setupac program will receive a parameter name for the current parameter that will be tested during the loop of FIG. 14 (i.e., between operation 702 and operation 710). Once the parameter name for the current parameter has been obtained, the method will proceed to an operation 726 where the AVF file name for the current parameter is received. Now the method operation proceeds to an operation 728 where names of each of both signals (i.e., a first signal and a second signal) that make up the current parameter are received. In this manner, the actual parameter being tested and its signals are properly obtained during the setupac program.

The method then proceeds to an operation 730 where it is determined if the first signal is an input or output, and if the second signal is an input or an output. Once a determination has been made as to what the signals are, the method will proceed to a decision operation 732 where it is determined whether both the first signal and the second signal are both inputs. If they are both inputs, the method will proceed to an operation 736 where the initial and final delay for the signal being moved is obtained. Initially, the first signal is moved and then the second signal is moved in order to determine whether the first and second signals are related to one another. Data for the signals being moved is stored in the test.doc file.

Now the method proceeds to an operation 738 where the cycle in which the signals are being moved in are obtained. This data is then placed into the test.doc file. Now, the method proceeds to an operation 740 where the cycle used to check failures is obtained and placed into the test.doc file. The method now proceeds to an operation 742 where the incremental value in which the signals will be moved is obtained. This incremental value may be a variable value set by the user such as a one nanosecond increment. This incremental value is also placed into the test.doc file. Now, the method proceeds to an operation 744 where the program gets the equation used to calculate the parameter.

For example, if setup and hold calculations are being performed, the equation may require that the time value of signal 1 be subtracted from the time value of signal 2, or the value of signal 2 be subtracted from the value of signal 1. Other similarly known equations that are configured to calculate other parameters in AC characteristic testing can also be implemented depending upon the parameter that the user selects for testing.

Referring back to decision operations 732, if it is determined that both the first and the second signals are not inputs, the method will proceed to another decision operation 734 where it is determined if one of the signals is an input and the other is an output. If this is true, the method will proceed through operations 746 through 758 in which data for performing setup and hold calculations is obtained.

Thus, beginning at operation 746, the time at which the transition type for the input signal is obtained. Once the transition information of the input signal is obtained in operation 746, the method will proceed to an operation 748 where transition information of the output signal is obtained. Now, the method proceeds to an operation 750 where the cycle that will be checked for failure is obtained.

At this point, the initial and final delay for the signal being moved is obtained and set in operation 752. Once the delay for the signal being moved is obtained, the method will proceed to an operation 754 where the cycle in which the signals being moved in is obtained. The incremental value to move the signals in is then obtained in operation 756, and then the equation used to calculate the setup and hold data in operation 758 is also obtained.

Referring now back to decision operation 734. If it is determined that both the first and second signals are outputs, the method will proceed to operations 760 through 768 where out-to-out timing characteristics are determined for the parameter being tested. The method of obtaining data for the out-to-out timing characteristics, which will then be input into the test.doc file, begins at operation 760 where a determination is made as to which output occurs first. After it is determined which output occurs first, the expected transition value for the first signal is obtained in operation 762 and the expected transition value for the second signal is obtained in operation 764.

Now that the expected transitions have been obtained, the method proceeds to an operation 766 where a determination is made as to what the cycle transition of the first signal is in operation 766. Now, the method proceeds to an operation 768 where the number of cycles between the transition of the first signal and the transition of the second signal is determined. At this stage of the setupac program, the method operations between 736 and 744, 746 and 758, and 760 and 768 will have been run, and values obtained for each of these determinations will have been placed into the test.doc file which will be used when the AVF2VAC program is run in operation 706 of FIG. 14. The method will now continue to operation 770 where ac_char.prm is generated.

Figure 16:
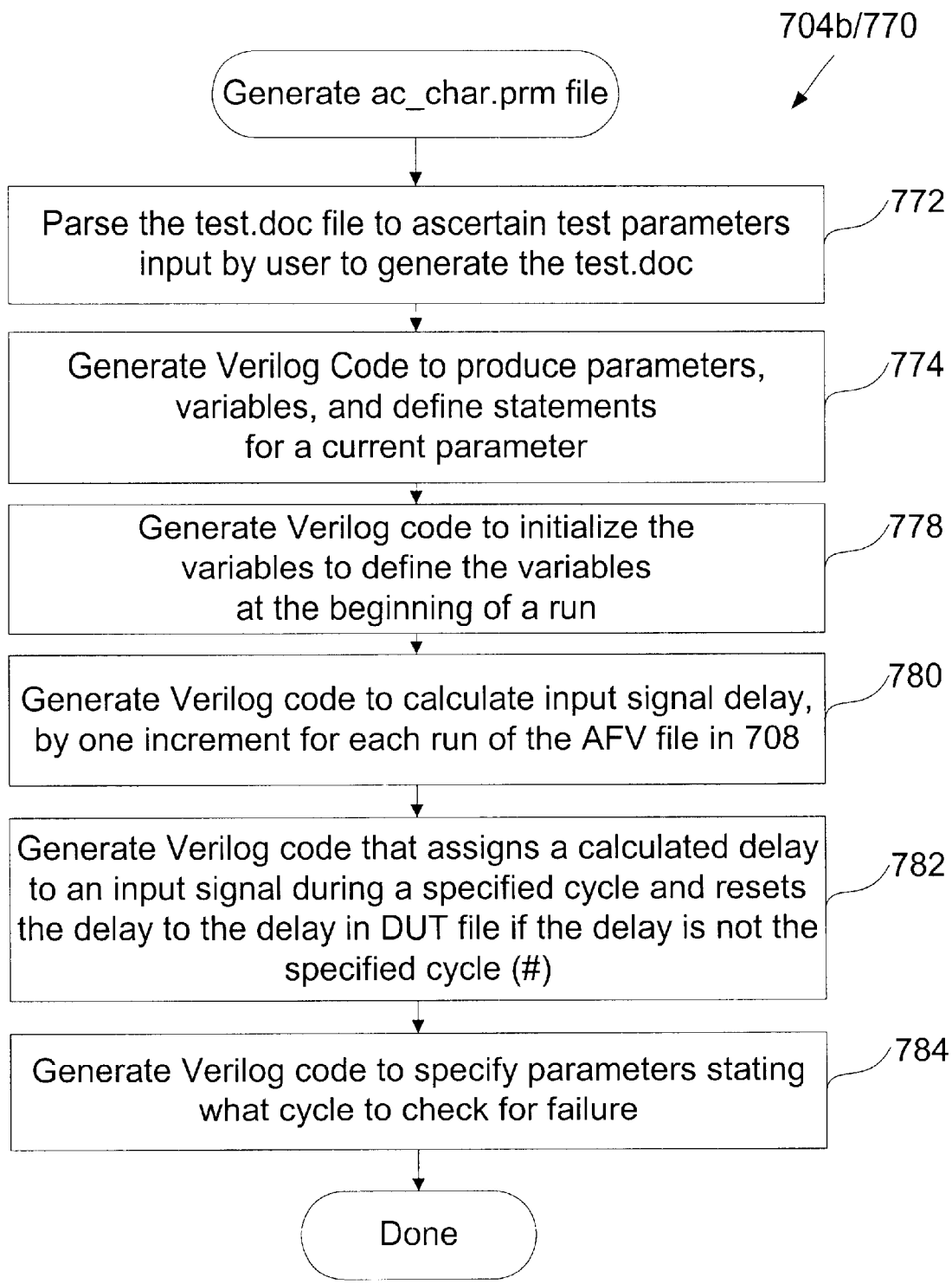
FIG. 16 illustrates the generation of the ac_char.prm file in accordance with one embodiment of the present invention.

FIG. 16 illustrates the generation of the ac_char.prm file (704b/770) in accordance with one embodiment of the present invention. For more information on the generation of an ac_char.prm file, reference can be made to Table I below. The method of generating the ac_char.prm file begins at an operation 772 where the test.doc file created during the execution of the setupac program of FIG. 15 is parsed to ascertain test parameters input by the user to generate the test.doc file. Next, the method will proceed to an operation 774 where Verilog code is generated in order to produce parameters, variables, and define statements for a current parameter.

The method then proceeds to an operation 778 where Verilog code is generated in order to initialize the variables to define the variables at the beginning of the run. Verilog code is then generated in order to calculate input signal delay, by one increment for each run of the AVF file of the loop of operation 708. Verilog code is then generated in order to assign a calculated delay to the input signal during a specified cycle. The method also includes resetting the delay to the delay in DUT file if it is not the specified cycle number (#) in operation 782. Now, the method will proceed to an operation 784 in which Verilog code is generated to specify parameters stating what cycle is being checked for failure. At this point, the method of generating the ac_char.prm file will be done.

Figure 17:
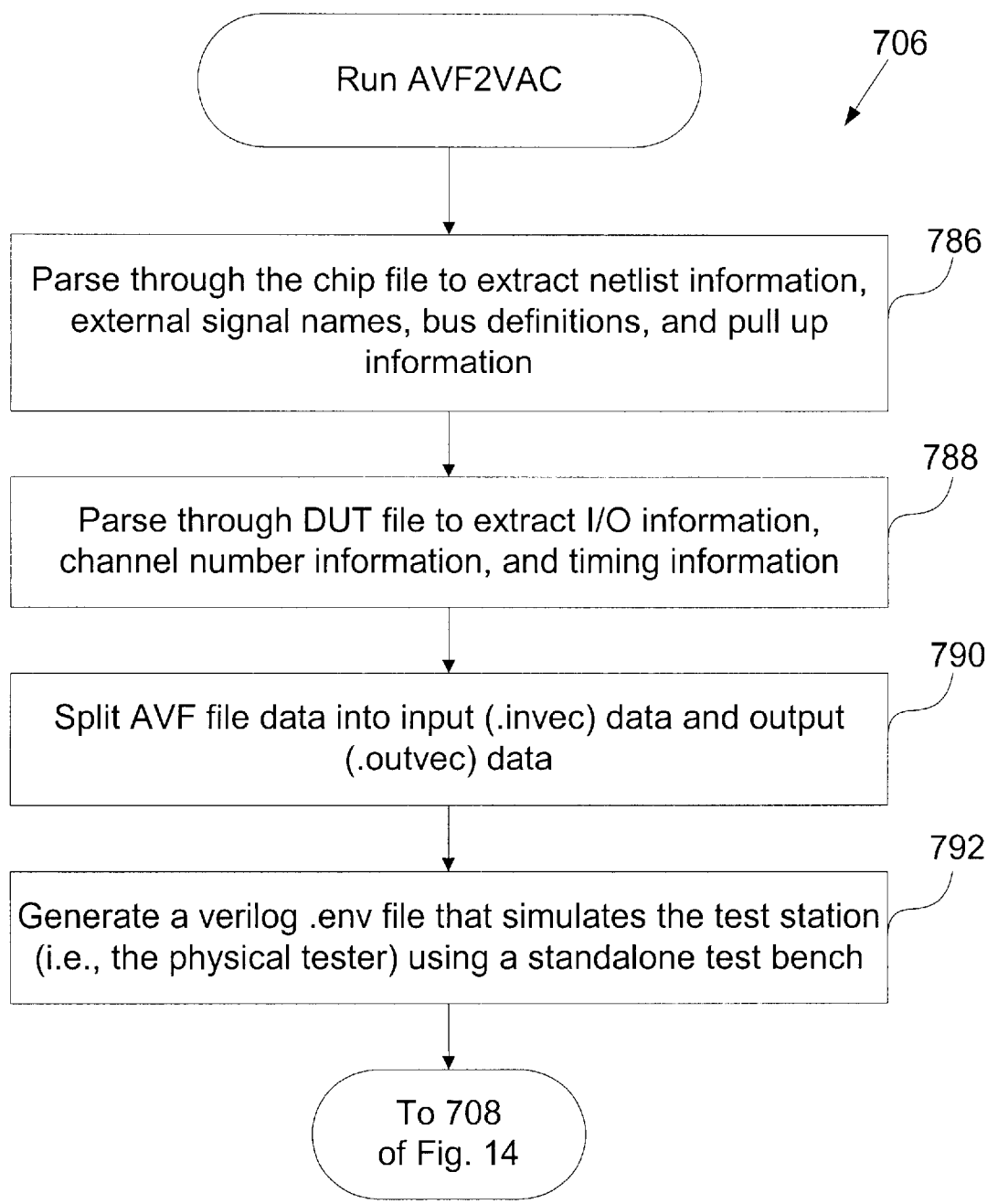
FIG. 17 illustrates in more detail the method operations of performed during a run of the avf2vac program in accordance with one embodiment of the present invention.

FIG. 17 illustrates in more detail the method operations of 706 performed during a run of the avf2vac program in accordance with one embodiment of the present invention. In operation 786, the method will parse through the chip file (e.g., chip file of Table E) to extract netlist information, external signal name information, bus definition information, and pull-up information. Once the parsing through the chip file has been performed, the method will proceed to an operation 788 where a parsing through the DUT file to extract I/O information, channel member information, and timing information is performed. As mentioned above, an exemplary DUT file is shown in Tables C1–C3. The method then proceeds to an operation 790 where the AVF file data is split into input data (.invec), and output data (.outvec). After the AVF data has been split, the method will proceed to an operation 792 where a Verilog .env file is generated, which is used to simulate the test station (i.e., the physical tester) using a standalone test bench. The standalone test bench will basically include the netlist for the chip design being tested. At this point, the method 706 that performs the running of the avf2vac program will proceed to operation 708 of FIG. 14.

Figure 18:
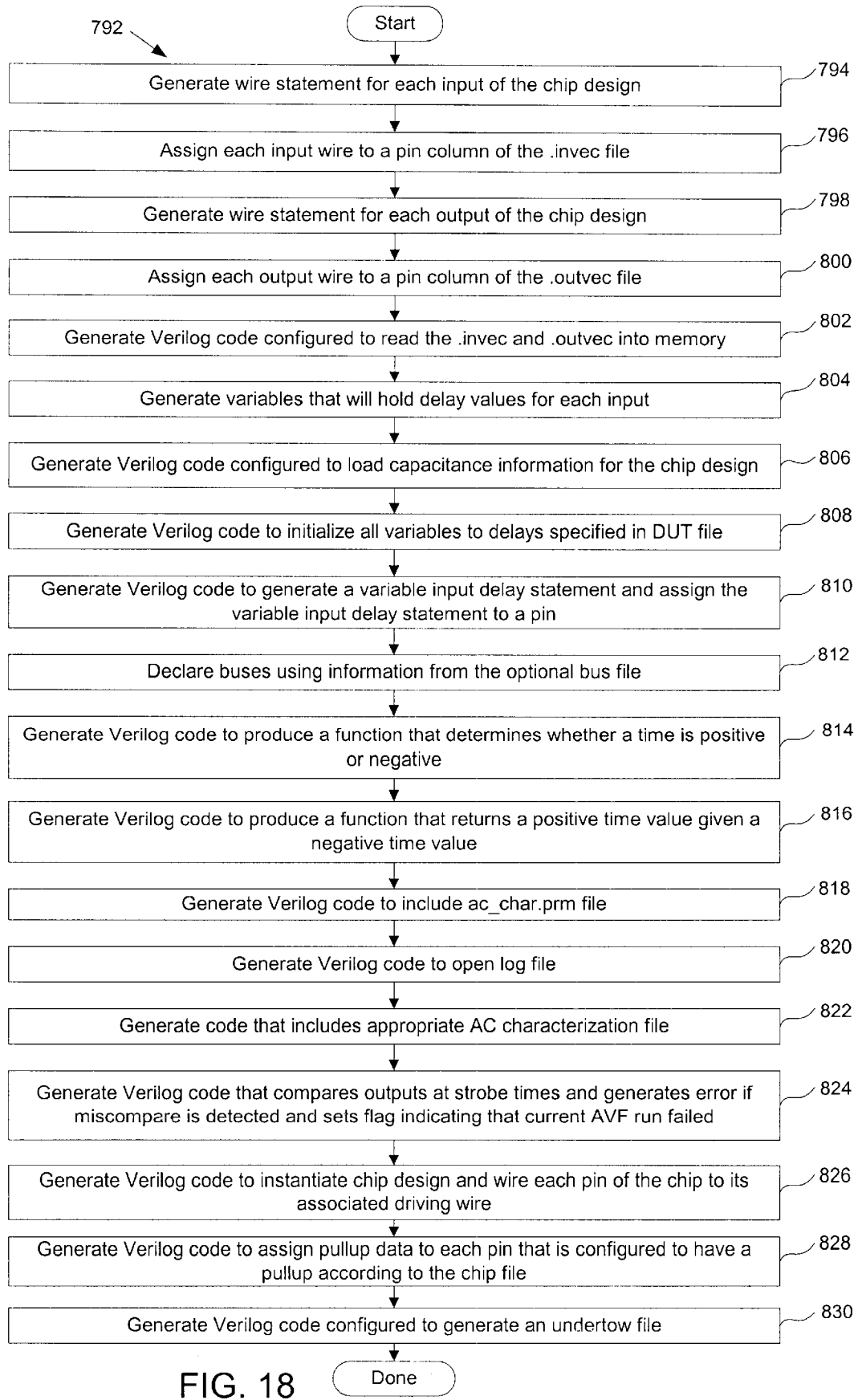
FIG. 18 illustrates in more detail the method operations performed, in accordance with one embodiment of the present invention.

FIG. 18 illustrates in more detail the method operations performed in 792, in accordance with one embodiment of the present invention. The method begins at an operation 794 where wire statements for each input of the chip design are generated. Next, the method will move to an operation 796 where each input pin is assigned to a pin column of the .invec file. In general, the .invec file is arranged in a memory array having columns for each pin in the chip design, and a row number for each cycle in a test. Next, the method will proceed to an operation 798 where wire statements for each output of the chip design are generated.

Once wire statements have been generated, the method will proceed to an operation 800 where each output wire is assigned to a pin column of the .outvec file. The method now proceeds to an operation 802 where Verilog code configured to read the .invec and .outvec data into memory is generated. After the read into memory is complete, the method proceeds to operation 804 where variables that will hold delay values for each input are generated. The method now proceed to an operation 806 where Verilog code configured to load capacitance information for the chip design is generated. As is well known, the chip wiring has particular capacitances for the various wires that should be approximated during the modeling of the chip design in order to approximate the actual true physical chip design circuit.

The method will then proceed to 808 where Verilog code that is configured to initialize all variables to delays specified in the DUT file is generated. This generation follows with Verilog code for generating a variable input delay statement and assign the variable input delay statement to a pin in operation 810. A declaration of buses using information from the optional bus file may then be performed in operation 812.

Generation of Verilog code to produce a function that determines whether a time is positive or negative is performed in operation 814. Then, Verilog code that is configured to produce a function that returns a positive time value given a negative time value is generated in operation 816. The method then follows to operation 818 where Verilog code configured to include the ac_char.prm file is generated, and additional Verilog code is generated to open the log files in operation 820. As mentioned above, the log files generally contain information for the results of the testing of the user selected parameters.

Verilog code is then generated to include the appropriate AC characterization file in 822. For example, there will be one AC characterization file for each parameter test, such as, an input-input test, an out-out test, and an in-out/out-in test, which are described above with reference to FIG. 15. For more detail on an example AC characterization file, reference may be made to Table H/J below. The method then continues to operation 824 where Verilog code that compares outputs at strobe times, generates errors if miscompares are detected, and sets a flag indicating when a current AVF run has failed, is generated.

The method proceeds to an operation 826 where Verilog code configured to instantiate the chip design and wire each pin of the chip to its associated driving wire, is generated. At this point, the method will proceed to an operation 828 where Verilog code configured to assign a pull-up to each pin that is configured to have a pull-up according to the chip file, is generated. Once the pull-up information has been configured, the method will proceed to an operation 830 where Verilog code configured to generate an undertow file is generated. An undertow file is one that can be executed using a well known undertow program that enables computer graphical inspection of signals to facilitate debugging of errors. At this point, the method will be done.

Figure 19:
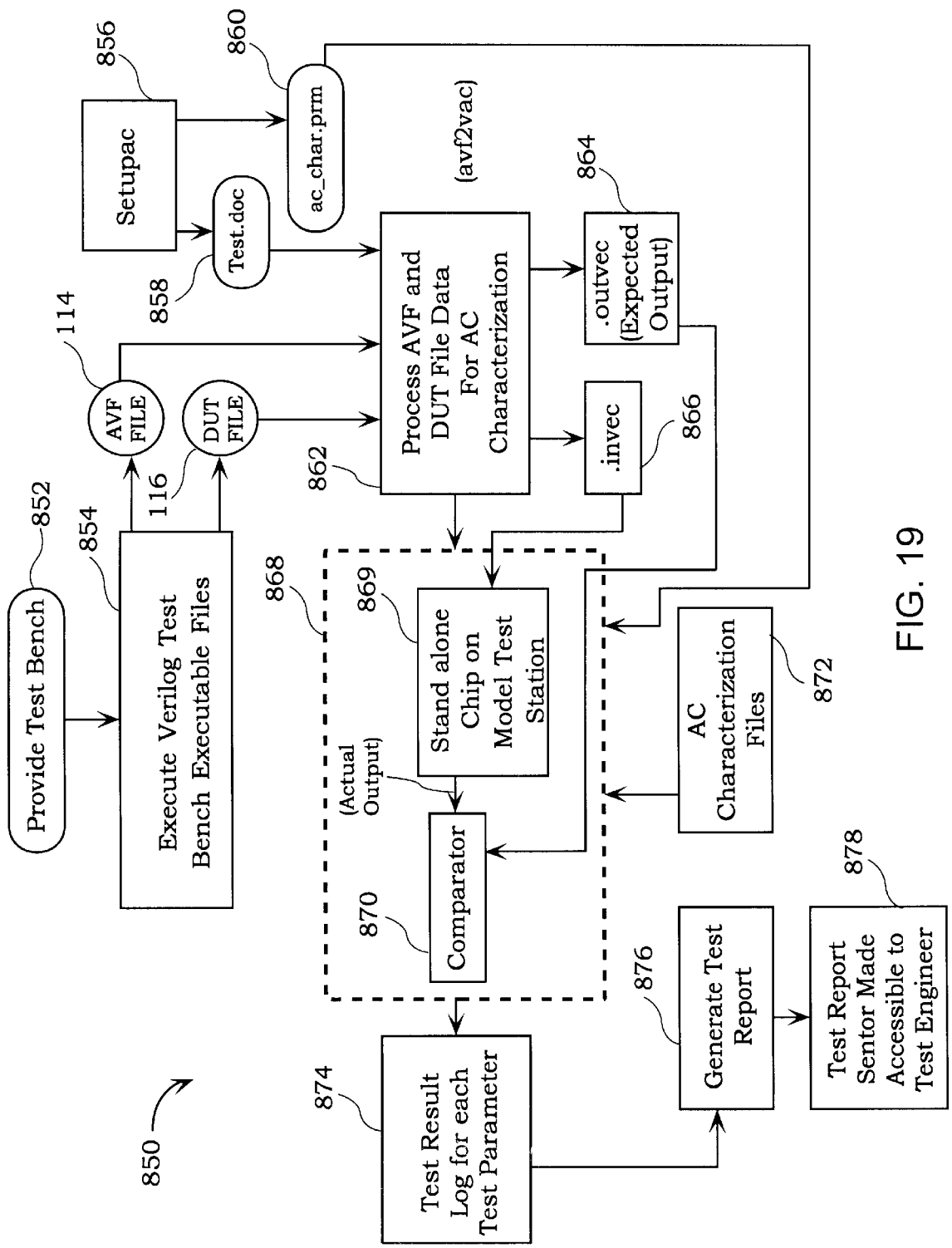
FIG. 19 illustrates a block diagram 850 of the software system implemented to carry-out the automated AC characterization of an integrated circuit part in accordance with one embodiment of the present invention.

FIG. 19 illustrates a block diagram 850 of the software system implemented to carry-out the automated AC characterization of an integrated circuit part in accordance with one embodiment of the present invention. Initially, a test bench is provided at 852, which is made available to a block 854. In block 854, the Verilog test bench executable files are run. Upon execution, an AVF file 114 and a DUT file 116 are generated. The AVF file 114 and the DUT file 116 are then provided to a block 862 which is configured to process the AVF file and the DUT file data for AC characterization. Also shown is the setupac block 856, which as described above, is implemented to produce a test.doc file 858 and the ac_char.prm 860. The test.doc file 858 is then provided to block 862.

The ac_char.prm 860 is provided to the model test station 868. Block 862 is also configured to communicate with the model test bench station 868 and produce .invec 866 and .outvec 864 (i.e., the expected output). The .invec is then communicated to the standalone chip on the model test station 869 and the .outvec is communicated to the comparator 870. The standalone chip on the model test station 869 will therefore produce an actual output that is passed to the comparator 870. In this embodiment, the AC characterization files 872 (e.g., one shown in Table J) are also provided to the model test station 868. The comparator 870 can then determine whether a match exists between what the expected output is and the actual output. The test results are then passed to block 874, which produces test result logs for each tested parameter. The logs are then communicated to block 876, which is configured to generate a test report, such as the example shown in Table F. The test report is then sent or made accessible to the test engineer in block 878.

Tables B through J are illustrated below for ease of reference. Although actual variables/code is provided in these illustrations, these variables/code should only be viewed as exemplary, and the actual variables/code can change depending upon the data of a particular part that will ultimately be the subject of testing in accordance with the present invention.

TABLE B

EXAMPLE GENERATED AVF FILE

111X111111X11111X11X1111111111XH101L0001XLL111111X111X1XH00H11HXHHHHHHHHHHHHHX0X
111X111111X11111X11X1111111111XH101L0001XLL111111X111X0XH00H11HXHHHHHHHHHHHHHX0X
111X111111X11111X11X1111111111XH101L0001XLL111111X111X1XH00H11HXHHHHHHHHHHHHHX0X
111X111111X11111X11X1111111111XH101L0001XLL111111X111X0XH00H11HXHHHHHHHHHHHHHX0X
111X111111X11111X11X1111111111XH101L0001XLL111111X111X1XH00H11HXHHHHHHHHHHHHHX0X
111X111111X11111X11X1111111111XH101L0001XLL111111X111X0XH00H11HXHHHHHHHHHHHHHX0X
111X111111X11111X11X1111111111XH101L0001XLL111111X111X1XH00H11HXHHHHHHHHHHHHHX0X
111X111111X11111X11X1111111111XH101L0001XLL111111X111X0XH00H11HXHHHHHHHHHHHHHX0X
111X111111X11111X11X1111111111XH101L0001XLL111111X111X1XH00H11HXHHHHHHHHHHHHHX0X
111X111111X11111X11X1111111111XH101L0001XLL111111X111X0XH00H11HXHHHHHHHHHHHHHX0X
111X111111X11111X11X1111111111XH101L0001XLL111111X111X1XH00H11HXHHHHHHHHHHHHHX0X
111X111111X11111X11X1111111111XH101L0001XLL111111X111X0XH00H11HXHHHHHHHHHHHHHX0X
111X111111X11111X11X1111111111XH101L0001XLL111111X111X1XH00H11HXHHHHHHHHHHHHHX0X
111X111111X11111X11X1111111111XH101L0001XLL111111X111X0XH00H11HXHHHHHHHHHHHHHX0X
111X111111X11111X11X1111111111XH101L0001XLL111111X111X1XH00H11HXHHHHHHHHHHHHHX0X
111X111111X11111X11X1111111111XH101L0001XLL111111X111X0XH00H11HXHHHHHHHHHHHHHX0X
111X111111X11111X11X1111111111XH101L0001XLL111111X111X1XH00H11HXHHHHHHHHHHHHHX0X
111X111111X11111X11X1111111111XH101L0001XLL111111X111X0XH00H11HXHHHHHHHHHHHHHX0X

TABLE C-1

Example DUT File (Timing)

```
DUT_DESCR_FILE
( Author              "ATELink User"
  DESIGNNAME          "ASIC_DESIGN"
  LOCATION            "ASIC_FOUNDRY"
)
declare
    simmap    (
              simstate     Isifstate     osifstate
              0            0             0
              1            1             1
              L            L             L
              H            H             H
              Z            Z             Z
              Z            Z             Z
              X            X             X
              X            X             X
              I            I             X
              )
```

TABLE C-2

Cont'd Example DUT File (Timing)

signal_list

| | | |
|---|---|---|
| inout | HD0 | (channel = 1); |
| inout | HD1 | (channel = 2); |
| inout | HD2 | (channel = 3); |
| inout | HD3 | (channel = 5); |
| inout | HD4 | (channel = 6); |
| inout | HD5 | (channel = 7); |
| inout | HD6 | (channel = 8); |
| inout | HD7 | (channel = 9); |
| inout | HD8 | (channel = 10); |
| inout | HD9 | (channel = 12); |
| inout | HD10 | (channel = 13); |
| inout | HD11 | (channel = 14); |
| inout | HD12 | (channel = 15); |
| inout | HD13 | (channel = 16); |
| inout | HD14 | (channel = 18); |
| inout | HD15 | (channel = 19); |
| inout | DASP_HSSTROBE | (channel = 21); |
| inout | PDIAG_HSGRANT_ | (channel = 22); |
| inout | HCS0_HSERROR | (channel = 23); |
| input | HCS1_HMBR | (channel = 24); |
| input | HA0 | (channel = 25); |
| input | HA1 | (channel = 26); |
| input | HA2 | (channel = 27); |
| inout | IOR_ | (channel = 28); |
| inout | IOW_ | (channel = 29); |
| inout | IOCHRDY | (channel = 30); |
| output | IOCS16_HSBR | (channel = 32); |
| input | HRST_ | (channel = 33); |
| inout | DMARQ | (channel = 34); |
| input | DMACK_HMREQ | (channel = 35); |
| inout | IRQ | (channel = 36); |
| inout | EOS_SGRANT | (channel = 37); |
| inout | AD0 | (channel = 114); |
| output | INTHB_INTHBD | (channel = 116); |
| inout | INTD_MA12 | (channel = 117); |

TABLE C-3

Cont'd Example DUT File (Timing)

timing Cycle ( period = 20ns;

FORCE stimulus REFCLK (format = R1, delay = 3.15ns, width = 10ns);
FORCE stimulus RCLK (format = DNRET, delay = 1ns);
FORCE stimulus ALE_INPUT2_CDRINT (format = DNRET, delay = 1ns);
FORCE stimulus R_WR_ (format = DNRET, delay = 4ns);
FORCE stimulus AD5 (format = DNRET, delay = 0ns);
FORCE stimulus AD3 (format = DNRET, delay = 0ns);
FORCE stimulus POR_ (format = DNRET, delay = 4ns);
FORCE stimulus HD0 format = DNRET, delay = 0ns);
FORCE stimulus HD1 (format = DNRET, delay = 0ns);
FORCE stimulus HD2 (format = DNRET, delay = 0ns);
FORCE stimulus HD3 (format = DNRET, delay = 0ns);
FORCE stimulus HD4 (format = DNRET, delay = 0ns);
FORCE stimulus HD5 (format = DNRET, delay = 0ns);
FORCE stimulus HD6 (format = DNRET, delay = 0ns);
FORCE stimulus HD7 (format = DNRET, delay = 0ns);
FORCE stimulus HD8 (format = DNRET, delay = 0ns);
FORCE stimulus HD9 (format = DNRET, delay = 0ns);
FORCE stimulus HD10 (format = DNRET, delay = 0ns);
FORCE stimulus HD11 (format = DNRET, delay = 0ns);
FORCE stimulus HD12 (format = DNRET, delay = 0ns);
FORCE stimulus HD13 (format = DNRET, delay = 0ns);
FORCE stimulus HD14 (format = DNRET, delay = 0ns);
FORCE stimulus HD15 (format = DNRET, delay = 0ns);
FORCE stimulus DASP_HSSTROBE (format = DNRET, delay = 0ns);
FORCE stimulus PDIAG_HSGRANT_ (format = DNRET, delay = 0ns);
FORCE stimulus HCS0_HSERROR (format = DNRET, delay = 0ns);
FORCE stimulus HCS1_HMBR_ (format = DNRET, delay = 0ns);
FORCE stimulus HA0 (format = DNRET, delay = 0ns);
FORCE stimulus HA1 (format = DNRET, delay = 0ns);
FORCE stimulus HA2 (format = DNRET, delay = 0ns);
FORCE stimulus IOR_ (format = DNRET, delay = 0ns);

TABLE D

WIRE DECLARATIONS FOR I/O ENABLES AND RESET

```
wire hd0_oen = test.u_top.u_iopad.n127_ && test.u_top.u_iopad.n127_ && test.u_to
wire hd1_oen = test.u_top.u_iopad.n127_ && test.u_top.u_iopad.n127_ && test.u_to
wire hd2_oen = test.u_top.u_iopad.n127_ && test.u_top.u_iopad.n127_ && test.u_to
wire hd3_oen = test.u_top.u_iopad.n127_ && test.u_top.u_iopad.n127_ && test.u_to
wire hd4_oen = test.u_top.u_iopad.n127_ && test.u_top.u_iopad.n127_ && test.u_to
wire hd5_oen = test.u_top.u_iopad.n127_ && test.u_top.u_iopad.n127_ && test.u_to
wire hd6_oen = test.u_top.u_iopad.n127_ && test.u_top.u_iopad.n127_ && test.u_to
wire hd7_oen = test.u_top.u_iopad.ihd7oen_ && test.u_top.u_iopad.ihd7oen_ && test
:
wire dasp_hsstrobe_oen = test.u_top.u_iopad.idasp_hsstrobeoen_ && test.u_top.u_i
wire pdiag_hsgrant_oen = test.u_top.u_iopad.ipdiag_hsgrant_oen_ && test.u_top.u
wire hsc0_hserror_oen = test.u_top.u_iopad.ihcs0_hserroroen_ && test.u_top.u_iop
wire ior_oen = test.u_top.u_iopad.hctloen_ && test.u_top.u_iopad.hctloen_;
wire iow_oen = test.u_top.u_iopad.hctloen_ && test.u_top.u_iopad.hctloen_;
wire iochrdy_oen = test.u_top.u_iopad.iiochrdyoen_ && test.u_top.u_iopad.iiochrd
wire iocs16_hsbr_oen = test.u_top.u_iopad.eniocs16od && 1'b0;
wire dmarq_oen = test.u_top.u_iopad.idmargoen_ && test.u_top.u_iopad.idmargoen_
:
wire nrz7_oen = test.u_top.u_iopad.inrz7_3oen_ && test.u_top.u_iopad.inrz7_3oen_
wire nrz6_oen = test.u_top.u_iopad.inrz7_3oen_ && test.u_top.u_iopad.inrz7_3oen_
wire nrz5_oen = test.u_top.u_iopad.inrzy_3oen_ && test.u_top.u_iopad.inrz7_3oen_
wire nrz4_oen = test.u_top.u_iopad.inrz7_3oen_ && test.u_top.u_iopad.inrz7_3oen_
wire nrz3_oen = test.u_top.u_iopad.inrz7_3oen_ && test.u_top.u_iopad.inrz7_3oen_
wire nrz2_wclk_oen = test.u_top.u_iopad.inrz2oen_ && test.u_top.u_iopad.inrz2oen
wire nrz1_oen = test.u_top.u_iopad.inrz1oen_ && test.u_top.u_iopad.inrz1oen_;
:
wire ba10_oen = test.u_top.u_iopad.btestoen_ && test.u_top.u_iopad.btestoen_;
wire ba9_oen = test.u_top.u_iopad.btestoen_ && test.u_top.u_iopad.btestoen_;
```

TABLE D-continued

WIRE DECLARATIONS FOR I/O ENABLES AND RESET

```
wire ba8_oen = test.u_top.u_iopad.btestoen_ && test.u_top.u_iopad.btestoen_;
wire ba7_oen = test.u_top.u_iopad.btestoen_ && test.u_top.u_iopad.btestoen_;
wire ba6_oen = test.u_top.u_iopad.btestoen_ && test.u_top.u_iopad.btestoen_;
wire ba5_oen = test.u_top.u_iopad.btestoen_ && test.u_top.u_iopad.btestoen_;
:
wire bd14_pse10_oen = test.u_top.u_iopad.ibdhoen_ && test.u_top.u_iopad.ibdhoen_;
wire bd13_pmux_oen = test.u_top.u_iopad.ibdhoen_ && test.u_top.u_iopad.ibdhoen_;
wire bd12_csp_oen = test.u_top.u_iopad.ibdhoen_ && test.u_top.u_iopad.ibdhoen_;
wire bd11_bsp_oen = test.u_top.u_iopad.ibdhoen_ && test.u_top.u_iopad.ibdhoen_;
wire bd10_rsel_oen = test.u_top.u_iopad.ibdhoen_ && test.u_top.u_iopad.ibdhoen_;
wire bd9_cslat_oen = test.u_top.u_iopad.ibdhoen_ && test.u_top.u_iopad.ibdhoen_;
wire: bd8_oen = test.u_top.u_iopad.ibdhoen_ && test.u_top.u_iopad.ibdhoen_;
:
wire bd5_oen = test.u_top.u_iopad.ibdloen_ && test.u_top.u_iopad.ibdloen_;
wire bd4_oen = test.u_top.u_iopad.ibdloen_ && test.u_top.u_iopad.ibdloen_;
wire bd3_oen = test.u_top.u_iopad.ibdloen_ && test.u_top.u_idpad.ibdloen_;
wire bd2_oen = test.u_top.u_iopad.ibdloen_ && test.u_top.u_iopad.ibdloen_;
:
wire ad4_oen = test.u_top.u_iopad.adoen_ && test.u_top.u_iopad.adoen_;
wire ad3_oen = test.u_top.u_iopad.adoen_ && test.u_top.u_iopad.adoen;
wire ad2_oen = test.u_top.u_iopad.adoen_ && test.u_top.u_iopad.adoen;
:
wire ma1_oen = test.u_top.u_iopad.imaoen_ && test.u_top.u_iopad.imaoen_;
wire ma0_oen = test.u_top.u_iopad.imaoen_ && test.u_top.u_iopad.imaoen_;
wire por_ = test.u_top.por_;
```

TABLE E

Example Chip File top.opus.va (Netlist for a chip design)
Pullup DATA

Pullup (sd_[15], sd_[14], sd_[13], sd_[12], sd_[11], sd_[10], sd_[9],
sd_[8], sd_[7], sd_[6], sd_[5], sd_[4], sd_[3], sd_[2], sd_[1],
sd_[0], sdp_[1], sdp [0], atn_, req_, ack_, cd_, io_, msg_, srst_,
sel_, bsy_, inthb_inthbd_, intd);
EXTERNAL SIGNAL NAMES (Chip Wiring to External Components)

module top ( ack_, atn_, bsy_, cd_, io_, msg_, req_, sd_, sdp_, sel_,
srst_, f20rr, sdloen_hgrant_, targ_hreq, selo_hstrobe,
bsyo_herror, sdhoen_srst_teststb2, xmit15_arben_hbr_,
xmit14_init_dbr, xmit13_sid3, xmit12_sid2, xmit11_sid1,
xmit10_sid0, xmit9_ma7, xmit8_ma6, xmit7_ma5, xmit6_ma4,
xmit5_ma3, xmit4_ma2, xmit3_ma1, xmit2_ma0, xmit1_bdp1_ma11,
xmit0_bdp0_ma10, biclk, ba11_ras1_, ba, bd15_pse11, bd14_pse10,
bd13_pmux, bd12_csp, bd11_bsp, bd10_rsel, bd9_dmode, bd8_bmmode,
bd, ras0_, cas0_, cas1_write1_, write_, eos, sector, syncf_index,
rg, wg, wrfault, nrz7, nrz6, nrz5, nrz4, nrz3, nrz2, nrz1, nrz0,
rclk, teststb1_nrzp, por_, cs, bs, r_wr_, e_rd_ds_, ale
ready_dsack_, ad, inthb_inthbd, intd, ma9, ma8);
BUS DECLARATIONS output [10 :0 ]
inout [7 : 0]    ad;
inout [7 : 0]    bd;
inout [15 : 0]   sd_;
inout [1 : 0]    sdp_;

TABLE F

Exemplary AC Characterization Report

| PARAM NAME | FILE | MEASURE TYPE | MEASURE RESULTS min,max CYCLES(S) (DATASHEET min,max) | INSTRUCTIONS/ COMMENTS |
|---|---|---|---|---|
| TC2POH | TC2POH.avf | setup/hold: | −1.00 (1,—) | move C2PO to start of cycle 1580 boundary, measured value must be < spec. min. equation: BCKI_DELAY − C2PO_DELAY |

TABLE F-continued

Exemplary AC Characterization Report

| PARAM NAME | FILE | MEASURE TYPE | MEASURE RESULTS min,max CYCLES(S) (DATASHEET min,max) | INSTRUCTIONS/ COMMENTS |
|---|---|---|---|---|
| TDIH | TDIH.avf | setup/hold: | 2.00 (1,—) | move SDATAI to start of cycle 1374 boundary, measured value must be < spec. min. equation: SDATAI_DELAY - BCKI_DELAY |
| TDIS | TDIS.avf | setup/hold: | 1.00 (2,—) | move SDATAI to end of cycle 1374 boundary, measured value must be < spec. min. equation: SDATAI_DELAY - BCKI_DELAY |
| TLRIS | TLRIS.avf | setup/hold: | −1.00 (2,—) | move LRCKI to end of cycle 1376 boundary, measured value must be < spec. min. equation: BCKI_DELAY - LRCKI_DELAY |
| TLRIH | TLRIH.avf | setup/hold: | 2.00 (0,—) | move LRCKI to start of cycle 1342 boundary, measured value must be < spec. min. equation: LRCKI_DELAY - BCKI_DELAY |

TABLE G

Exemplary Log file For One Parameter

```
* - TEST BENCH: AC Characterization Run Number: 0 - *
TEST BENCH: C2PO delay (from cycle boundary): 40.00ns
TEST BENCH: BCKI delay (from cycle boundary): 30.00ns
TEST BENCH: Current parameter TC2POH value: −10.00ns
TEST BENCH: Test did not fail in run number: 0
* - TEST BENCH: AC Characterization Run Number: 1 - *
TEST BENCH: C2PO delay (from cycle boundary): 39.00ns
TEST BENCH: BCKI delay (from cycle boundary): 30.00ns
TEST BENCH: Current parameter TC2POH value: −9.00ns
TEST BENCH: Test did not fail in run number: 1
* - TEST BENCH: AC Characterization Run Number: 2 - *
TEST BENCH: C2PO delay (from cycle boundary): 38.00ns
TEST BENCH: BCKI delay (from cycle boundary): 30.00ns
TEST BENCH: Current parameter TC2POH value: −8.00ns
TEST BENCH: Test did not fail in run number: 2
* - TEST BENCH: AC Characterization Run Number: 3 - *
TEST BENCH: C2PO delay (from cycle boundary): 37.00ns
TEST BENCH: BCKI delay (from cycle boundary): 30.00ns
TEST BENCH: Current parameter TC2POH value: −7.00ns
TEST BENCH: Test did not fail in run number: 3
* - TEST BENCH: AC Characterization Run Number: 4 - *
TEST BENCH: C2PO delay (from cycle boundary): 36.00ns
TEST BENCH: BCKI delay (from cycle boundary): 30.00ns
TEST BENCH: Current parameter TC2POH value: −6.00ns
TEST BENCH: Test did not fail in run number: 4
* - TEST BENCH: AC Characterization Run Number: 5 - *
TEST BENCH: C2PO delay (from cycle boundary): 35.00ns
TEST BENCH: BCKI delay (from cycle boundary): 30.00ns
TEST BENCH: Current parameter TC2POH value: −5.00ns
TEST BENCH: Test did not fail in run number: 5
* - TEST BENCH: AC Characterization Run Number: 6 - *
TEST BENCH: C2PO delay (from cycle boundary): 34.00ns
TEST BENCH: BCKI delay (from cycle boundary): 30.00ns
TEST BENCH: Current parameter TC2POH value: −4.00ns
TEST BENCH: Test did not fail in run number: 6
* - TEST BENCH: AC Characterization Run Number: 7 - *
TEST BENCH: C2PO delay (from cycle boundary): 33.00ns
TEST BENCH: BCKI delay (from cycle boundary): 30.00ns
TEST BENCH: Current parameter TC2POH value: −3.00ns
TEST BENCH: Test did not fail in run number: 7
* - TEST BENCH: AC Characterization Run Number: 8 - *
TEST BENCH: C2PO delay (from cycle boundary): 32.00ns
TEST BENCH: BCKI delay (from cycle boundary): 30.00ns
TEST BENCH: Current parameter TC2POH value: −2.00ns
TEST BENCH: Test did not fail in run number: 8
* - TEST BENCH: AC Characterization Run Number: 9 - *
TEST BENCH: C2PO delay (from cycle boundary): 31.00ns
TEST BENCH: BCKI delay (from cycle boundary): 30.00ns
TEST BENCH: Current parameter TC2POH value: −1.00ns
TEST BENCH: Test did not fail in run number: 9
* - TEST BENCH: AC Characterization Run Number: 10 - *
TEST BENCH: C2PO delay (from cycle boundary): 30.00ns
TEST BENCH: BCKI delay (from cycle boundary): 30.00ns
TEST BENCH: Current parameter TC2POH value: 0.00ns
TEST BENCH: Failure occured at cycle = 1837
        *** End of TC2POH search ***
TEST BENCH: Starting schmooze process.
* - TEST BENCH: AC Characterization Run Number: 0 - *
TEST BENCH: C2PO delay (from cycle boundary): 30.00ns
TEST BENCH: BCKI delay (from cycle boundary): 30.00ns
TEST BENCH: Current parameter TC2POH value: 0.00ns
TEST BENCH: Failure occured at cycle = 1837
* - TEST BENCH: AC Characterization Run Number: 1 - *
TEST BENCH: C2PO delay (from cycle boundary): 30.00ns
TEST BENCH: BCKI delay (from cycle boundary): 29.00ns
TEST BENCH: Current parameter TC2POH value: −1.00ns
TEST BENCH: Test did not fail in run number: 1
* - TEST BENCH: AC Characterization Run Number: 2 - *
TEST BENCH: C2PO delay (from cycle boundary): 29.00ns
TEST BENCH: BCKI delay (from cycle boundary): 29.00ns
TEST BENCH: Current parameter TC2POH value: 0.00ns
TEST BENCH: Failure occured at cycle = 1837
TEST BENCH: Setup/Hold relationship found.
TEST BENCH: Final result TC2POH = −1.00ns
```

TABLE H

Exemplary Verilog File Having Out-to-Out Data

```
AC_CHAR_OUT2OUT.VT - For output delay from one output to another.
Comment:
///////////////////////////////////////////////
Check for expected transition at given cycle or whole pattern
///////////////////////////////////////////////
reg prm_measured, sig1trans;
```

TABLE H-continued

Exemplary Verilog File Having Out-to-Out Data

```
integer indx, sig1cycle;
reg [1:'PATTERNS] outsig_trans;
time startpt1 [1:'PATTERNS], startpt2 [1:'PATTERNS];
time timeincr [1:'PATTERNS], tmeas [1:'PATTERNS];
time sig1dly [1:'PATTERNS], sig2dly [1:'PATTERNS];
time timeincr_min, min_TMEAS, max_TMEAS;
time temptimest1, temptimest2;
time min_sig1dly, max_sig1dly, min_sig2dly, max_sig2dly;
time temptimeincr1, temptimeincr2;
reg neg_max_TMEAS, neg_min_TMEAS;
initial begin
    prm_measured = 0;
    sig1trans = 0;
    timeincr_min = CYCLETIME;
    min_TMEAS = CYCLETIME*20;
    max_TMEAS = 0;
    min_sig1dly = CYCLETIME*20;
    max_sig1dly = 0;
    min_sig2dly = CYCLETIME*20;
    max_sig2dly = 0;
    for (indx= 1;indx<= 'PATTERNS;indx=indx+1)
      begin
        outsig_trans[indx] = 0)
        startpt1[indx] = 0;
        startpt2[indx] = 0;
        timeincr[indx] = CYCLETIME/2;
        tmeas[indx] = 0;
        sig1dly[indx] = 0;
        sig2dly[indx] = 0;
      end
end
always @(cyclenumber)
if (runumber == 0)
 begin
    #(0.95*CYCLETIME);
    if((OUTSIG1 === 1'b1) &&
    ((cyclenumber == CHK_CYCLE1 && CHK_ALL_CYC == 0) ||
    (cyclenumber<='PATTERNS && CHK_ALL_CYC!=0)))
      begin
        sig1trans = 1;
        sig1cycle = cyclenumber;
      end
 end
else if (outsig_trans[cyclenumber+CYCS_BTWN_SIGS] == 1)
 begin
    temptimest1 <= $time;
    temptimeincr1 <= timeincr[cyclenumber+CYCS_BTWN_SIGS];
    #(startpt1[cyclenumber]+timeincr[cyclenumber+CYCS_BTWN_SIGS]);
    if (OUTSIG1 === 1'b1)
      sig1dly[cyclenumber] <= $time - temptimest1;
    else
      startpt1[cyclenumber] = startpt1[cyclenumber]+temptimeincr1;
 end
always @(cyclenumber)
if (runnumber == 0)
 begin
    #(0.95*CYCLETIME+1);
    if (sig1trans == 1) && (cyclenumber == (sig1cycle+CYCS_BTWN_SIGS)))
      begin
        if (OUTSIG2 === 1'b1)
          begin
            outsig_trans[cyclenumber] = 1;
            prm_measured = 1;
          end
        sig1trans = 0;
      end
 end
else if (outsig_trans[cyclenumber] == 1)
 begin
    temptimest2 <= $time;
    temptimeincr2 <= timeincr∂cyclenumber];
    #(startpt2[cyclenumber]+timeincr[cyclenumber]);
    if (OUTSIG2 === 1'b1)
      sig2dly∂cyclenumber] <= $time - temptimest2;
    else
      startpt2∂cyclenumber]= startpt2[cyclenumber]+temptimeincr2;
    timeincr[cyclenumber] = timeincr[cyclenumber]/2;
```

TABLE H-continued

Exemplary Verilog File Having Out-to-Out Data

```
      if (timeincr[cyclenumber] < timeincr_min)
        timeincr_min = timeincr[cyclenumber];
    end
always @(test_fail)
  if (test_fail == 1)
    begin
      $fdisplay(log_chan,"TEST BENCH [ERROR]: Unexpected failure occured at
cycle = %0d", cyclenumber);
        end_testing;
      end
Comment:
////////////////////////////////////////////////////
Step through input and output vectors cycle by cycle
////////////////////////////////////////////////////
initial
  begin
    runumber = 0;
  end
initial
begin
  test_fail = 0;
  $readmemb('STIMULUS_FILE, in_mem);
  $readmemb('COMPARISON_FILE, exp_mem);
  while (timeincr_min > INCR)
    begin
      for (cyclenumber=1; cyclenumber<='PATTERNS; cyclenumber=cyclenumber+1)
#CYCLETIME;
      if ((runumber == 0) && (prm_measured == 0))
        begin
          if (CHK_ALL_CYC == 0)
          %fdisplay(log_chan,"TEST BENCH [ERROR]: Unable to measure parameter
%s from cycle %0d to %0d", 'MEASPAR, CHK_CYCLE1,
(CHK_CYCLE1+CYCS_BTWN_SIGS));
          else
            $fdisplay(log_chan,"TEST BENCH [ERROR]: Unable to measure parameter
%s", 'MEASPAR);
          end_testing;
        end
      runumber = runumber + 1;
    end
if (prm_measured == 1)
  begin
      for (indx=1;indx<='PATTERNS;indx=indx+1)
        if (outsig_trans[indx] == 1)
          begin
            tmeas[indx] = poseqn (sig2dly[indx] - sig1dly[indx-
CYCS_BTWN_SIGS] + CYCLETIME*CYCS_BTWN_SIGS);
          if (neg_meas == 1)
            $fdisplay(log_chan,"TEST BENCH: Parameter %s from cycle %0d
to %0d is: -%0t", 'MEASPAR, (indx-CYCS_BTWN_SIGS), indx, tmeas[indx]);
          else
          $fdisplay(log_chan,"TEST BENCH: Parameter %s from cycle %0d to
      %0d is: %0t", 'MEASPAR, (indx-CYCS_BTWN_SIGS), indx, tmeas[indx]);
          if (sig1dly[indx-CYCS_BTWN_SIGS] > max_sig1dly)
            max_sig1dly = sig1dly[indx-CYCS_BTWN_SIGS];
          if (sig1dly[indx-CYCS_BTWN_SIGS] < min_sig1dly)
            min_sig1dly = sig1dly[indx-CYCS_BTWN_SIGS];
          if (sig2dly[indx] > max_sig2dly)
            max_sig2dly = sig2dly[indx];
          if (sig2dly[indx] < min_sig2dly)
            min_sig2dly = sig2dly[indx];
          max_TMEAS = poseqn (max_sig2dly - min_sig1dly +
CYCLETIME*CYCS_BTWN_SIGS);
            neg_max_TMEAS = neg_meas;
            min_TMEAS = poseqn (min_sig2dly - max_sig1dly +
CYCLETIME*CYCS_BTWN_SIGS);
            neg_min_TMEAS = neg_meas;
          end
      $fdisplay(log_chan,"");
        if (neg_min_TMEAS == 1)
          $fdisplay(log_chan,"TEST BENCH: Minimum value for %s is\t: -%0t",
'MEASPAR, min_TMEAS);
      else
        $fdisplay(log_chan,"TEST BENCH: Minimum value for %s is\t: %0t",
'MEASPAR, min_TMEAS);
        $fdisplay(log#chan,"    Corresponding to\t\t: %0d*CYCLETIME + %0t -
%0t", CYCS_BTWN_SIGS min_sig2dly, max_sig1dly);
```

TABLE H-continued

Exemplary Verilog File Having Out-to-Out Data

```
    if (neg_max_TMEAS == 1)
      $fdisplay(log_chan,"TEST BENCH: Maximum value for %s is\t: -%0t",
'MEASPAR, max_TMEAS);
    else
      $fdisplay(log_chan,"TEST BENCH: Maximum value for %s is\t: %0t",
'MEASPAR, max_TMEAS);
      $fdisplay(log_chan,"    Corresponding to\t\t: %0d*CYCLETIME + %0t -
%0t", CYCS_BTWN_SIGS max_sig2dly, min_sig1dly);
      $fdisplay(log_chan,"");
    end
  end_testing;
end
```

---

(AC_char.prm file)

```
'define SETHOLD_MEAS
'define MEASPAR "TDIS"
'define INPUT_SIG "SDATAI"
'define SIG1 "BCKI"
'define MAX_RUNS 7
parameter INCR = 100;
parameter CHK_CYCLE = 0;
parameter MOVE_CYCLE = 1374;
parameter INPR01 = 0;
parameter INPUT_SIG_WIDTH = 0;
parameter SIG1R01 = 0;
parameter SIG1_WIDTH = 0;
integer SCHMZ;
time INIT_INP_DLY, INIT_INP_WTH;
time INPUT_SIG_DELAY, SIG1_DELAY;
time NXT_INPUT_SIG_DELAY, NXT_SIG1_DELAY;
time RST_INPUT_SIG_DELAY, RST_SIG1_DELAY;
time TMEAS;
initial
 begin
    INIT_INP_DLY = 2070;
    INIT_INP_WTH = 0;
    SCHMZ = 0;
 end
always @ (runumber or SCHMZ)
 if (SCHMZ == 1)
    begin
        NXT_INPUT_SIG_DELAY = INIT_INP_DLY + (runumber / 2) * INCR;
        NXT_SIG1_DELAY = 3000 + ((runumber + 1) / 2) * INCR;
    end
 else
    begin
        NXT_INPUT_SIG_DELAY = INIT_INP_DLY + (runumber * INCR) ;
        NXT_SIG1_DELAY = 3000;
    end
initial
 begin
    #2;
    RST_INPUT_SIG_DELAY = SDATAI_DELAY;
    RST_SIG1_DELAY = BCKI_DELAY;
 end
wire chg_tg = (MOVE_CYCLE == cyclenumber + 1) ;
wire reset_tg = (MOVE_CYCLE == cyclenumber) ;
reg negdly;
always @ (NXT_INPUT_SIG_DELAY or NXT_SIG1_DELAY or chg_tg or reset_tg)
begin
        if ((MOVE_CYCLE == 0) || chg_tg)
          set_new_tg;
        else if (reset_tg)
          set_old_tg;
end
task set_new_tg;
        begin
           negdly = negval (NXT_INPUT_SIG_DELAY) ;
           if ((negdly == 0) && (NXT_INPUT_SIG_DELAY < CYCLETIME))
             begin
                INPUT_SIG_DELAY = NXT_INPUT_SIG_DELAY;
```

-continued (AC_char.prm file)

```
                SDATAI_DELAY = INPUT_SIG_DELAY;
            end
        negdly = negval (NXT_SIG1_DELAY;
        BCKI_DELAY = SIG1_DELAY;
            begin
                SIG1_DELAY = NXT_SIG1_DELAY;
                BCKI_DELAY = SIG1_DELAY;
            end
        set_tmeas;
        end
endtask
task set_old_tg;
    begin
        SDATAI_DELAY = RST_INPUT_SIG_DELAY;
        BCKI_DELAY = RST_SIG1_DELAY;
    end
endtask
task set_tmeas;
    begin
        fork
            #INPUT_SIG_WIDTH;
            #SIG1_WIDTH;
        join
        TMEAS = poseqn (SDATAI_DELAY - BCKI_DELAY) ;
    end
endtask
// Make this parameter equal to 1 to specify cycle in which
// to check for failure. Test stops if failure occurs in
// cycle other than (CHK_CYCLE +/- 1).
parameter FAIL_CYC_CHK = 0;
```

TABLE J (AC Characterization File)

```
// Number of runs for schmoo process
'define SMAX_RUNS 3
time TMEAS_SAVE, TMEAS_OLD;
reg neg_meas_save, neg_meas_old;
initial
begin
    TMEAS_SAVE = 0;
    neg_meas_save = 0;
    TMEAS_OLD = 0;
    neg_meas_old = 0;
end
///////////////////////////////////////////////////////////////////
// SETUP-HOLD Parameter Measurement Preamble
///////////////////////////////////////////////////////////////////
always @(log_chan_opened or runumber or chg_tg)
    if ((log_chan_opened == 1) &&
        (((SCHMZ == 0) && (runumber < 'MAX_RUNS)) ||
         ((SCHMZ == 1) && (runumber < 'SMAX_RUNS))) &&
        ((MOVE_CYCLE == 0) || chg_tg))
    begin
        #100;
        $fdisplay(log_chan, " ") ;
        $fdisplay(log_chan, "* - TEST BENCH: AC Characterization Run Number: %0d
        $fdisplay(log_chan, "TEST BENCH: %s delay (from cycle boundary) : %0t" 'I
        if (INPR01 > 0)
            $fdisplay(log_chan,"TEST BENCH: %s width: %0t", 'INPUT_SIG, INPUT_SIG_
        $fdisplay(log_chan,"TEST BENCH: %s delay (from cycle boundary) : %0t", 'S
        if (SIG1R01 > 0)
            $fdisplay(log_chan,"TEST BENCH: %s width: %0t", 'SIG1, SIG1_WIDTH) ;
        log_meas;
    end
task log_meas;
    begin
        #CYCLETIME;
        if (neg_meas == 1)
            $fdisplay(log_chan,"TEST BENCH: Current parameter %s value: -%0t", 'ME
        else
            $fdisplay(log_chan,"TEST BENCH: Current parameter %s value: %0t", 'MEA
        $fdisplay(log_chan, " ") ;
```

TABLE J-continued (AC Characterization File)

```
        end
    endtask
//////////////////////////////////////////////////////////////////
// Check if error(s) occur at expected cycle       //
//////////////////////////////////////////////////////////////////
reg test_fail_old, sh_prm_found, rel_found,test_failed;
always @(test_fail)
    if (test_fail == 1)
        begin
            #1;
            if (FAIL_CYC_CHK)
                if ((cyclenumber == CHK_CYCLE) ||
                    (cyclenumber == CHK_CYCLE − 1) ||
                    (cyclenumber == CHK_CYCLE + 1 ))
                    begin
                        $fdisplay(log_chan, "TEST BENCH: Expected failure occured at cycl
                        if (SCHMZ == 0)
                            begin
                                TMEAS_SAVE = TMEAS_OLD;
                                neg_meas_save = neg_mesa_old;
                                INIT_INP_DLY = INPUT_SIG_DELAY;
                                if (INPR01 > 0)
                                    INIT_INP_WTH = INPUT_SIG_WIDTH;
                                SCHMZ = 1;       // begin schmoozing to find relationship
                                sh_prm_found = 1;
                                test_failed = 1;
                                $fdisplay(log_chan, " ") ;
                                $fdisplay(log_chan, "\t*** End of %s search ***", 'MEASPAR) ;
                                $fdisplay(log_chan, " ") ;
                                $fdisplay(log_chan, "TEST BENCH: Starting schmooze process.")
                            end
                    end
                else
                    begin
                        $fdisplay(log_chan, "TEST BENCH [ERROR]: Unexpected failure occur
                        end_testing;
                    end
            else
                begin
                    $fdisplay(log_chan, "TEST BENCH: Failure occured at cycle = %0d", cyc
                    if (SCHMZ == 0)
                        begin
                            TMEAS_SAVE = TMEAS_OLD;
                            neg_meas_save = neg_meas_old;
                            INIT_INP_DLY = INPUT_SIG_WIDTH;
                            if (INPR01 > 0)
                                INIT_INP_WTH = INPUT_SIG_WIDTH;
                            SCHMZ = 1;       // begin schmoozing to find relationship
                    sh_prm_found = 1;
                    test_failed = 1;
                    $fdisplay(log_chan," ") ;
                    $fdisplay(log_chanm"\t*** End of %s search ***", 'MEASPAR) ;
                    %fdisplay(log_chan," ") ;
                    %fdisplay(log_chan,"TEST BENCH: Starting schmooze process.") ;
                    end
            end
end
//////////////////////////////////////////////////////////////////
// Step through input and output vectors cycle by cycle //
//////////////////////////////////////////////////////////////////
initial
    begin
        runumber = 0;
        sh_prm_found = 0;
        test_fail_old = 0;
        rel_found = 0;
        test_failed = 0;
    end
initial
begin
    $readmemb('STIMULUS_FILE, in_mem) ;
    $readmemb('COMPARISON_FILE, exp_mem) ;
    while (((SCHMZ == 0) && (runumber < 'MAX_RUNS)) ||
        ((SCHMZ == 1) && (runumber < 'SMAX_RUNS)))
        begin
            test_fail = 0;
            for (cyclenumber=1; cyclenumber<='PATTERNS; cyclenumber=cyclenumber+1) #
```

TABLE J-continued (AC Characterization File)

```
            if (test_fail == 0)
            begin
              $fdisplay(log_chan,"TEST BENCH: Test did not fail in run number: %0d",
              TMEAS_OLD = TMEAS;
              neg_meas_old = neg_meas;
            end
            if (sh_prm_found == 1)
            begin
              runumber = 0;
              sh_prm_found = 0;
            end
            else
              runumber = runumber + 1;
            if (SCHMZ == 1)
            begin
              rel_found = (test_fail !== test_fail_old) ;
              test_fail_old = test_fail;
            end
          end
        $fdisplay(log_chan, " ") ;
        if (SCHMZ == 1)
        begin
          if (rel_found == 1)
            $fdisplay(log_chan, "TEST BENCH: Setup/Hold relationship found.") ;
          else
            $fdisplay(log_chan, "TEST BENCH [ERROR] : Setup/Hold relationship not foun
        end
        else
        begin
            $fdisplay(log_chan, " ") ;
            $fdisplay(log_chan, "TEST BENCH [ERROR] : Unable to measure parameter %s,
        end
        if (test_failed == 1)
          begin
            $fdisplay(log_chan, " ") ;
            if (neg_meas_save == 1)
              $fdisplay(log_chan, "TEST BENCH: Final result %s = -%0t", 'MEASPAR, TME
            else
              $fdisplay(log_chan, "TEST BENCH: Final result %s = %0t", 'MEASPAR, TMEA
          end
    end_testing;
end
```

The present invention may be implemented using any type of integrated circuit logic, state machines, or software driven computer-implemented operations as described above. By way of example, a hardware description language (HDL) based design and synthesis program may be used to design the silicon-level circuitry necessary to appropriately perform the data and control operations in accordance with one embodiment of the present invention. Although any suitable design tool may be used, a hardware description language "Verilog®" tool available from Cadence Design Systems, Inc. of Santa Clara, Calif. is used.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A computer implemented method for testing alternating current characteristics of a computer model of an integrated circuit design, comprising:

(a) supplying an AVF file and a Device Under Test (DUT) file of the integrated circuit design;

(b) generating a test file containing data of a parameter of the integrated circuit design, wherein the parameter includes a setup and hold parameter, a pulse width parameter, and an out-to-out parameter;

(c) parsing through a chip file of the integrated circuit design in order to extract netlist information, external signal names, bus definitions, and pull-up information;

(d) parsing through the DUT file to extract input/output information, channel number information, and timing information;

(e) splitting data of the AVF file into input vector data and output vector data;

(f) generating an environment file that assists in simulating a physical test station;

(g) running the environment file through Verilog using the input vector data and the output vector data in order to generate a log that indicates alternating current test results for the parameter data;

(h) providing a report file, the DUT file, and the test file to the physical test station in order to generate physical test station data;

(i) comparing the generated physical test station data with the report file that contains test data from testing the computer model of the integrated circuit design; and (j) determining inconsistencies between the generated physical test station data and the report file.

2. A computer implemented method for testing alternating current characteristics of a computer model of an integrated circuit design as recited in claim 1, further comprising:

determining whether anymore parameters remain to be tested; and executing (b) through (g) in order to generate log files for parameters being tested if it is determined that more parameters remain to be tested.

3. A computer implemented method for testing alternating current characteristics of a computer model of an integrated circuit design as recited in claim 1, further comprising:

generating an alternating current characteristics parameter file, the generating includes, parsing through the test file;

generating parameters, variables, and define statements for the parameter;

initializing the variables;

calculating input signal delays for a run of the AVF file;

assigning a calculated delay to a delay of an input signal during a specified cycle and resetting the delay of the input signal to another delay from the DUT file if the delay is not the specified cycle number; and specifying parameters indicative of what cycle to check for a failure.

4. A computer implemented method for testing alternating current characteristics of a computer model of an integrated circuit design as recited in claim 1, wherein the report file details data regarding the setup and hold parameter of a plurality of signals, the pulse width parameter of the plurality of signals, and the out-to-out parameter of the plurality of signals.

5. A computer readable media containing program instructions for testing alternating current characteristics of a computer model of an integrated circuit design that includes an associated AVF file and an associated Device Under Test (DUT) file, the computer readable media comprising:

(a) program instructions for generating a test file containing data of a parameter of the integrated circuit design, wherein the parameter includes a setup and hold parameter, a pulse width parameter, and an out-to-out parameter;

(b) program instructions for parsing through a chip file of the integrated circuit design in order to extract netlist information, external signal names, bus definitions, and pull-up information;

(c) program instructions for parsing through the DUT file to extract input/output information, channel number information, and timing information;

(d) program instructions for splitting data of the AVF file into input vector data and output vector data;

(e) program instructions for generating an environment file that assists in simulating a physical test station;

(f) program instructions for running the environment file using the input vector data and the output vector data in order to generate a log that indicates alternating current test results for the parameter data;

(g) program instructions for providing the report file, the DUT file, and the test file to the physical test station in order to generate physical test station data;

(h) program instructions for comparing the generated physical test station data with the report file that contains test data from testing the computer model of the integrated circuit design; and (i) program instructions for determining inconsistencies between the generated physical test station data and the report file.

6. A computer readable media containing program instructions for testing alternating current characteristics of a computer model of an integrated circuit design as recited in claim 5, further comprising:

program instructions for determining whether anymore parameters remain to be tested; and program instructions for executing (a) through (f) in order to generate log files for parameters being tested if it is determined that more parameters remain to be tested.

7. A computer readable media containing program instructions for testing alternating current characteristics of a computer model of an integrated circuit design as recited in claim 5, further comprising:

program instructions for generating an alternating current characteristics parameter file, the generating includes, program instructions for parsing through the test file;

program instructions for generating parameters, variables, and define statements for the parameter;

program instructions for initializing the variables;

program instructions for calculating input signal delays for a run of the AVF file;

program instructions for assigning a calculated delay to a delay of an input signal during a specified cycle and resetting the delay of the input signal to another delay from the DUT file if the delay is not the specified cycle number; and program instructions for specifying parameters indicative of what cycle to check for a failure.

8. A computer readable media containing program instructions for testing alternating current characteristics of a computer model of an integrated circuit design as recited in claim 5, wherein the report file details data regarding the setup and hold parameter of a plurality of signals, the pulse width parameter of the plurality of signals, and the out-to-out parameter of the plurality of signals.

9. A computer readable media containing program instructions for testing alternating current characteristics of a computer model of an integrated circuit design that includes an associated AVF file and an associated Device Under Test (DUT) file, the computer readable media comprising:

(a) program instructions for generating a test file containing data of a parameter of the integrated circuit design, the test file being generated based upon whether a pair of signals are either both inputs, or one is an input and another is an output;

(b) program instructions for parsing through a chip file of the integrated circuit design in order to extract netlist information, external signal names, bus definitions, and pull-up information;

(c) program instructions for parsing through the DUT file to extract input/output information, channel number information, and timing information;

(d) program instructions for splitting data of the AVF file into input vector data and output vector data;

(e) program instructions for generating an environment file that assists in simulating a physical test station;

(f) program instructions for running the environment file using the input vector data and the output vector data in order to generate a log that indicates alternating current test results for the parameter data;

(g) program instructions for providing the report file, the DUT file, and the test file to the physical test station in order to generate physical test station data;

(h) program instructions for comparing the generated physical test station data with the report file that contains test data from testing the computer model of the integrated circuit design; and (i) program instructions for determining inconsistencies between the generated physical test station data and the report file.

10. A computer readable media containing program instructions for testing alternating current characteristics of a computer model of an integrated circuit design as recited in claim 9, further comprising:

program instructions for determining whether anymore parameters remain to be tested; and program instructions for repeating (a) through (f) in order to generate log files for parameters being tested if it is determined that more parameters remain to be tested.

11. A computer readable media containing program instructions for testing alternating current characteristics of a computer model of an integrated circuit design as recited in claim 9, further comprising:

program instructions for generating an alternating current characteristics parameter file, the generating includes, program instructions for parsing through the test file;

program instructions for generating parameters, variables, and define statements for the parameter;

program instructions for initializing the variables;

program instructions for calculating input signal delays for a run of the AVF file;

program instructions for assigning a calculated delay to a delay of an input signal during a specified cycle and resetting the delay of the input signal to another delay from the DUT file if the delay is not the specified cycle number; and program instructions for specifying parameters indicative of what cycle to check for a failure.

* * * * *